(12) United States Patent
Ozawa et al.

(10) Patent No.: US 10,090,235 B2
(45) Date of Patent: Oct. 2, 2018

(54) SEMICONDUCTOR DEVICE AND SEMICONDUCTOR PACKAGE

(71) Applicant: Toshiba Memory Corporation, Minato-ku (JP)

(72) Inventors: Isao Ozawa, Chigasaki (JP); Isao Maeda, Yokohama (JP); Yasuo Kudo, Higashiyamato (JP); Koichi Nagai, Tokyo (JP); Katsuya Murakami, Tokyo (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 290 days.

(21) Appl. No.: 14/183,803

(22) Filed: Feb. 19, 2014

(65) Prior Publication Data

US 2015/0130059 A1 May 14, 2015

Related U.S. Application Data

(60) Provisional application No. 61/904,229, filed on Nov. 14, 2013.

(51) Int. Cl.
*H01L 23/48* (2006.01)
*H01L 23/52* (2006.01)
(Continued)

(52) U.S. Cl.
CPC ........ *H01L 23/49838* (2013.01); *H01L 23/50* (2013.01); *H01L 25/0652* (2013.01);
(Continued)

(58) Field of Classification Search
CPC . H01L 2924/01079; H01L 2924/01029; H01L 2924/01078; H01L 25/117;
(Continued)

(56) References Cited

U.S. PATENT DOCUMENTS 6,641,411 B1* 11/2003 Stoddard ........... H01L 23/49838
257/E23.07
6,929,979 B2 8/2005 Andoh
(Continued)

FOREIGN PATENT DOCUMENTS

| JP | 2001-291793 | 10/2001 |
| JP | 2003-124390 | 4/2003 |
| JP | 2008-182062 | 8/2008 |

OTHER PUBLICATIONS

U.S. Appl. No. 14/642,083, filed Mar. 9, 2015, Nagai, et al.

*Primary Examiner* — Matthew Reames
*Assistant Examiner* — Young W. Kim
(74) *Attorney, Agent, or Firm* — Oblon, McClelland, Maier & Neustadt, L.L.P.

(57) ABSTRACT

According to one embodiment, a semiconductor device includes a board, a sealing portion, a controller, a semiconductor chip, and solder balls. The board includes a first surface and a second surface opposite to the first surface. The controller and the semiconductor chip are covered with the sealing portion. The solder balls are on the second surface of the board. The solder balls include a plurality of solder ball sets each corresponding to a pair of differential input and differential output signals, and the plurality of solder ball sets are arranged substantially parallel to a side of the board.

15 Claims, 23 Drawing Sheets

(51) Int. Cl.
*H01L 29/40* (2006.01)
*H01L 23/13* (2006.01)
*H01L 23/498* (2006.01)
*H01L 23/50* (2006.01)
*H01L 25/065* (2006.01)
*H01L 23/31* (2006.01)
*H01L 23/66* (2006.01)
*H01L 23/00* (2006.01)
*H01L 25/18* (2006.01)

(52) U.S. Cl.
CPC ...... *H01L 25/0657* (2013.01); *H01L 23/3128* (2013.01); *H01L 23/3135* (2013.01); *H01L 23/66* (2013.01); *H01L 24/32* (2013.01); *H01L 24/48* (2013.01); *H01L 24/73* (2013.01); *H01L 25/18* (2013.01); *H01L 2223/6638* (2013.01); *H01L 2224/04042* (2013.01); *H01L 2224/06135* (2013.01); *H01L 2224/06136* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2224/83191* (2013.01); *H01L 2225/0651* (2013.01); *H01L 2225/06506* (2013.01); *H01L 2225/06562* (2013.01); *H01L 2924/00014* (2013.01); *H01L 2924/15311* (2013.01); *H01L 2924/181* (2013.01); *H01L 2924/3025* (2013.01); *H01L 2924/351* (2013.01)

(58) Field of Classification Search
CPC ..... H01L 23/498; H01L 23/482; H01L 23/13; H01L 23/552; H01L 23/49822; H01L 23/49838; H01L 23/50; H01L 24/92; H01L 24/14; H01L 2924/15311
USPC ......... 257/E23.069, E23.021, 737, 738, 780, 257/785–787, 777, 697; 438/108, 438/612–614, 118; 174/262, 255; 361/780, 794, 729
See application file for complete search history.

(56) References Cited

U.S. PATENT DOCUMENTS

| | | |
|---|---|---|
| 7,095,107 B2 | 8/2006 | Ramakrishnan et al. |
| 7,151,319 B2 | 12/2006 | Iida et al. |
| 7,253,520 B2 | 8/2007 | Yoshida et al. |
| 2001/0028110 A1 | 10/2001 | Andoh |
| 2003/0071363 A1 | 4/2003 | Yoshida et al. |
| 2003/0127736 A1* | 7/2003 | Eto ............... H01L 25/0657 257/737 |
| 2009/0289348 A1* | 11/2009 | Tang ............... H01L 23/50 257/697 |
| 2010/0213611 A1* | 8/2010 | Isa ............... H01L 23/13 257/738 |
| 2012/0187564 A1* | 7/2012 | Tsuge ............. H01L 23/49822 257/773 |
| 2013/0021760 A1* | 1/2013 | Kim ............... H01L 24/92 361/729 |
| 2013/0052775 A1* | 2/2013 | Kim ............... H01L 23/552 438/118 |

* cited by examiner

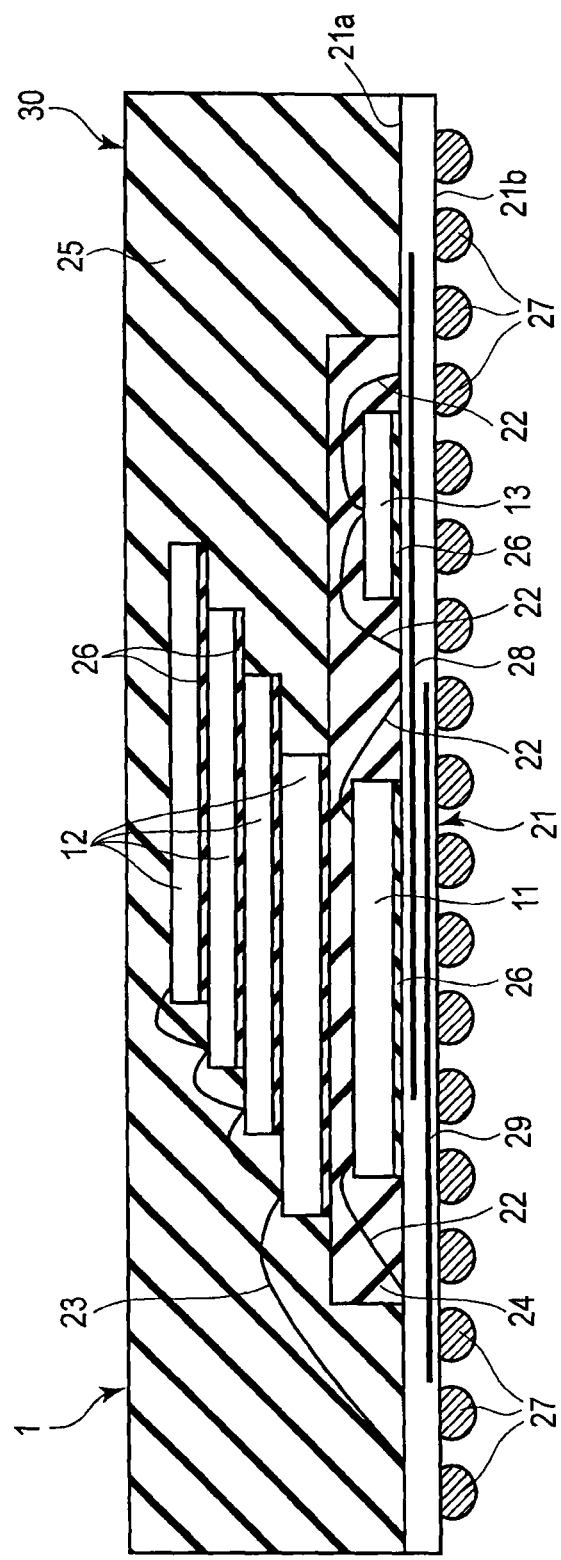
F I G. 5

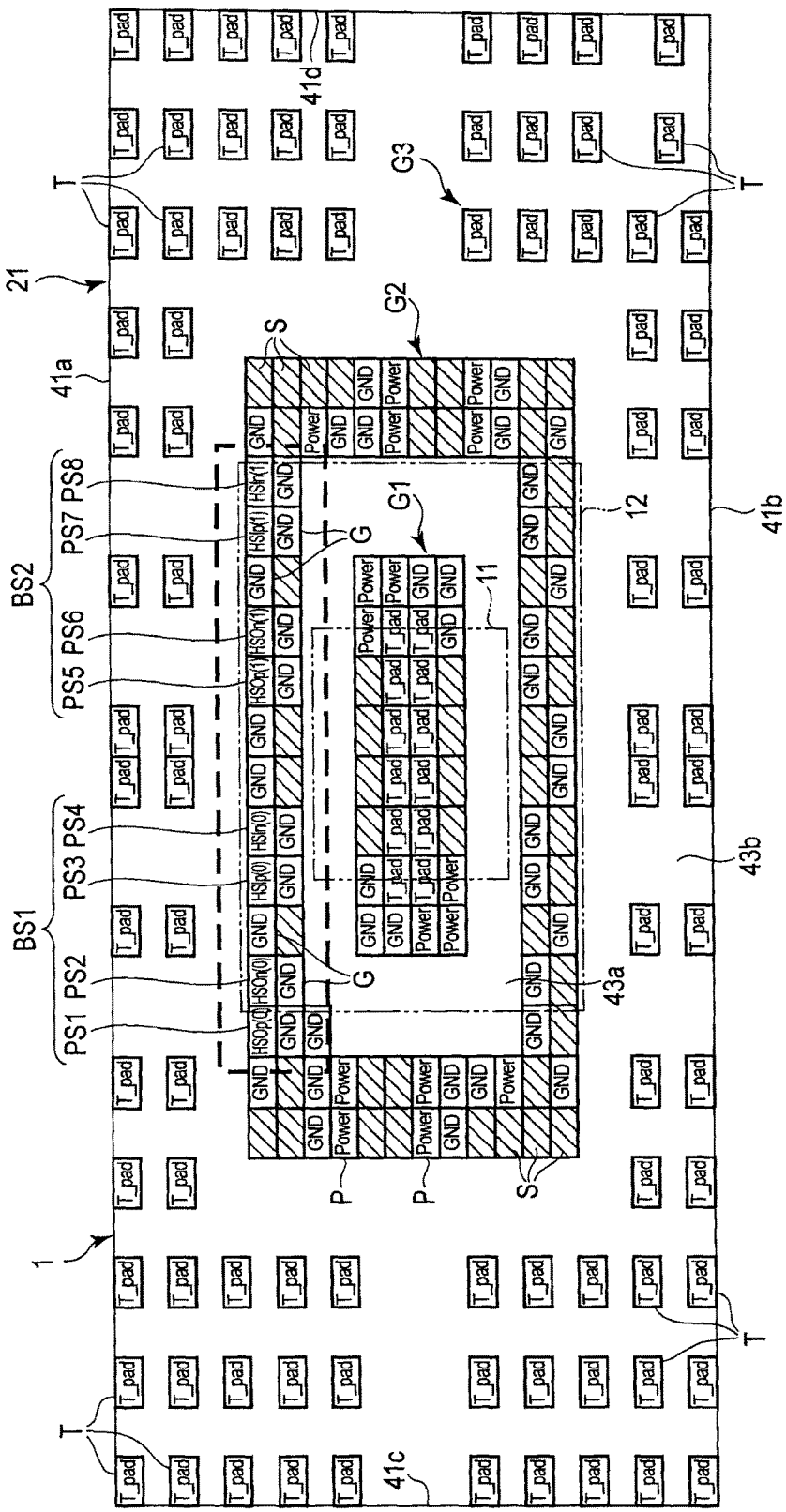
F I G. 8

| Name of ball | Content |
|---|---|
| HSOp (0) | PCIe high-speed differential signal (output) of first set |
| HSOn (0) | PCIe high-speed differential signal (output) of first set |
| HSIp (0) | PCIe high-speed differential signal (input) of first set |
| HSIn (0) | PCIe high-speed differential signal (input) of first set |
| HSOp (1) | PCIe high-speed differential signal (output) of second set |
| HSOn (1) | PCIe high-speed differential signal (output) of second set |
| HSIp (1) | PCIe high-speed differential signal (input) of second set |
| HSIn (1) | PCIe high-speed differential signal (input) of second set |

F I G. 9

| Name of ball | Content |
|---|---|
| PERp (0) | PCIe high-speed differential signal (input) of first set |
| PERn (0) | PCIe high-speed differential signal (input) of first set |
| PETp (0) | PCIe high-speed differential signal (output) of first set |
| PETn (0) | PCIe high-speed differential signal (output) of first set |
| PERp (1) | PCIe high-speed differential signal (input) of second set |
| PERn (1) | PCIe high-speed differential signal (input) of second set |
| PETp (1) | PCIe high-speed differential signal (output) of second set |
| PETn (1) | PCIe high-speed differential signal (output) of second set |
| PERp (2) | PCIe high-speed differential signal (input) of third set |
| PERn (2) | PCIe high-speed differential signal (input) of third set |
| PETp (2) | PCIe high-speed differential signal (output) of third set |
| PETn (2) | PCIe high-speed differential signal (output) of third set |
| PERp (3) | PCIe high-speed differential signal (input) of fourth set |
| PERn (3) | PCIe high-speed differential signal (input) of fourth set |
| PETp (3) | PCIe high-speed differential signal (output) of fourth set |
| PETn (3) | PCIe high-speed differential signal (output) of fourth set |

F I G. 15

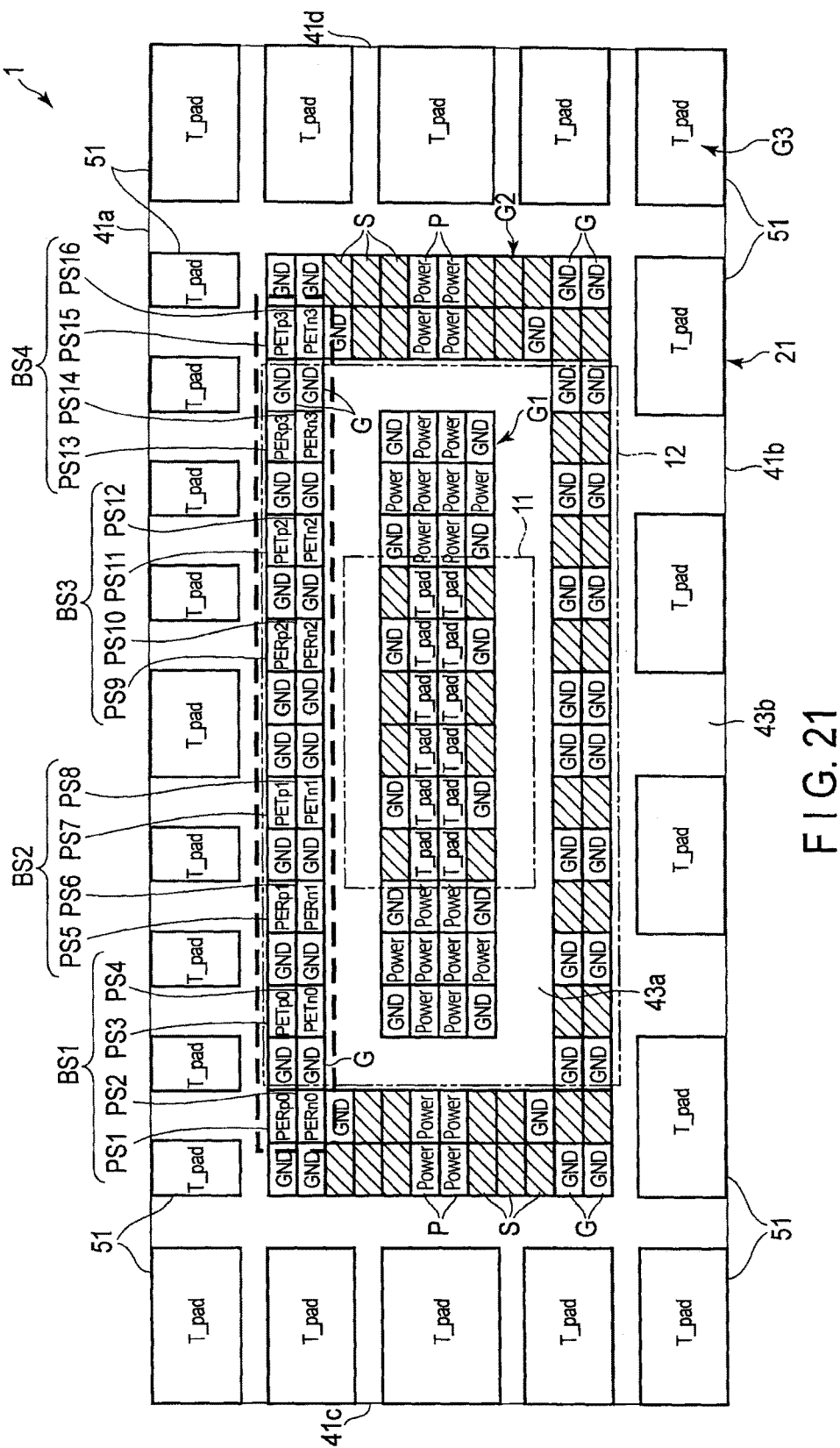
F I G. 21

US 10,090,235 B2

SEMICONDUCTOR DEVICE AND SEMICONDUCTOR PACKAGE

CROSS-REFERENCE TO RELATED APPLICATIONS

This application claims the benefit of U.S. Provisional Application No. 61/904,229, filed Nov. 14, 2013, the entire contents of which are incorporated herein by reference.

FIELD

Embodiments described herein relate generally to semiconductor devices and semiconductor packages.

BACKGROUND

In semiconductor devices comprising semiconductor memory chips, there is a desire to improve high-speed operation of the semiconductor devices.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 5 is an exemplary sectional view illustrating a first modification of the semiconductor package shown in FIG. 1.

FIG. 8 illustrates, as an example, assignment of solder balls shown in FIG. 7.

FIG. 9 illustrates, as an example, contents of the assignment shown in FIG. 8.

FIG. 15 illustrates, as an example, contents of the assignment shown in FIG. 14.

FIG. 21 illustrates, as an example, a third modification of the semiconductor package according to the third embodiment.

DETAILED DESCRIPTION

Various embodiments will be described hereinafter with reference to the accompanying drawings.

In general, according to one embodiment, a semiconductor device comprises a board, a sealing portion, a controller, a semiconductor chip, and solder balls. The board comprises a first surface and a second surface opposite to the first surface. The sealing portion is on the first surface of the board. The controller is covered with the sealing portion. The semiconductor chip is electrically connected to the controller and covered with the sealing portion. The solder balls are on the second surface of the board. The solder balls comprise a plurality of solder ball sets each corresponding to a pair of differential input and differential output signals. The solder ball sets are arranged substantially parallel to a side of the board.

In this specification, some components are expressed by two or more terms. These terms are merely examples. The components may be further expressed by another or other terms. The other components which are not expressed by two or more terms may be expressed by another or other terms.

Also, the drawings are schematic ones, and may be different from actual things in relationship between a thickness and a planar size or in ratio of a thickness of each of layers. In addition, a portion in which a relationship or ratio of size is different between the drawings may be present.

(First Embodiment)

FIGS. 1 to 11 illustrate a semiconductor package 1 according to a first embodiment. The semiconductor package 1 is an example of a semiconductor device. The semiconductor package 1 according to this embodiment is a so-called ball grid array-solid state drive (BGA-SSD), and a plurality of semiconductor memory chips and a controller are integrally constituted as a package of a BGA type.

Figure 1:
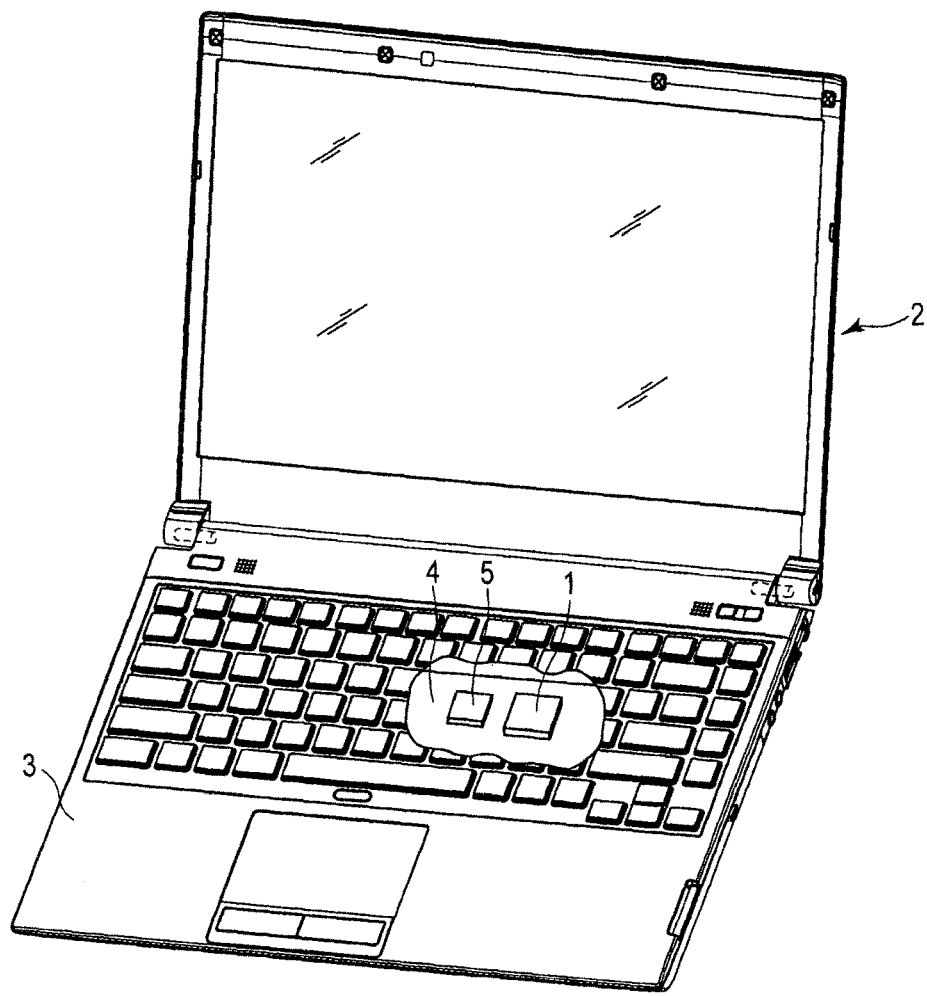
FIG. 1 is an exemplary perspective view illustrating an electronic apparatus according to a first embodiment.

FIG. 1 illustrates an example of an electronic apparatus 2 in which the semiconductor package 1 is mounted. The electronic apparatus 2 comprises a housing 3 and a circuit board 4 (e.g., main board) contained in the housing 3. The semiconductor package 1 is attached to the circuit board 4, and functions as a storage device of the electronic apparatus 2. The circuit board 4 comprises a host controller 5 (e.g., CPU). The host controller 5 includes, for example, a south bridge and controls the whole operation of the electronic apparatus 2 including the semiconductor package 1.

Figure 2:
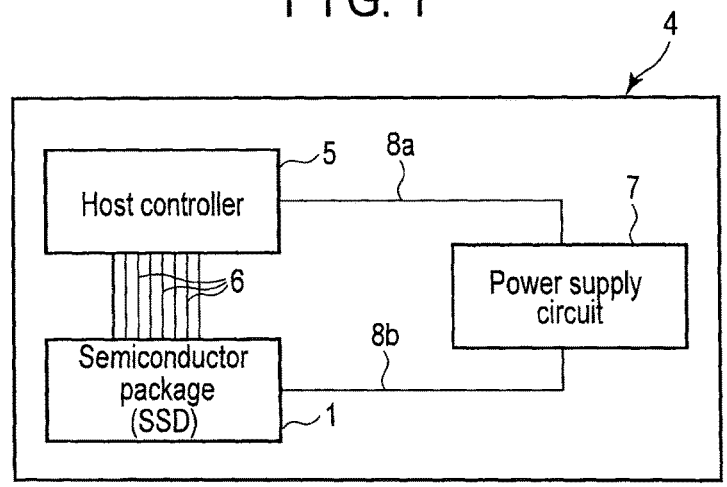
FIG. 2 is an exemplary block diagram illustrating part of a configuration of a circuit board shown in FIG. 1.

FIG. 2 schematically shows part of a configuration of the circuit board 4. The host controller 5 and the semiconductor package 1 according to this embodiment comprise an interface conforming to the PCI Express (hereinafter referred to as PCIe) standard. A plurality of signal lines 6 are provided between the host controller 5 and the semiconductor package 1. The semiconductor package 1 exchanges high-speed signals conforming to the PCIe standard with the host controller 5 through the signal lines 6.

A power supply circuit 7 is provided on the circuit board 4. The power supply circuit 7 is connected to the host controller 5 and the semiconductor package 1 through power supply lines 8a and 8b. The power supply circuit 7 supplies various power sources for operating the electronic apparatus 2 to the host controller 5 and the semiconductor package 1.

Next, the configuration of the semiconductor package 1 will be described.

Figure 3:
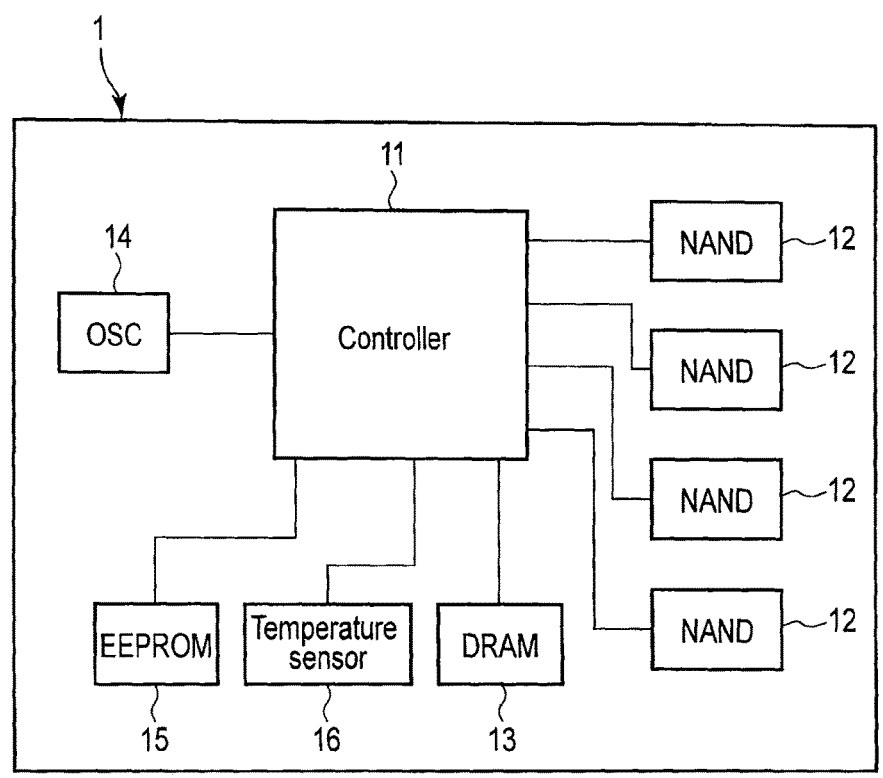
FIG. 3 is an exemplary block diagram illustrating a configuration of a semiconductor package shown in FIG. 1.

FIG. 3 is a block diagram illustrating an example of the configuration of the semiconductor package 1. The semiconductor package 1 comprises a controller chip 11, semiconductor memory chips 12, a DRAM chip 13, an oscillator (OSC) 14, an electrically erasable and programmable ROM (EEPROM) 15 and a temperature sensor 16.

The controller chip 11 (i.e., controller) is a semiconductor chip configured to control the operation of the semiconductor memory chips 12. The semiconductor memory chip 12 is, for example, a NAND chip (i.e., NAND flash memory). The NAND chip is a nonvolatile memory and holds data even in a state where power supply is not performed. The DRAM chip 13 is used for storage of management information of the semiconductor memory chips 12, cache of data, etc.

The oscillator (OSC) 14 supplies an operation signal at a predetermined frequency to the controller chip 11. The EEPROM 15 stores a control program, etc., as fixed information. The EEPROM 15 is an example of the nonvolatile memory. The temperature sensor 16 detects the temperature inside the semiconductor package 1 and indicates it to the controller chip 11.

The controller chip 11 controls the operation of each part of the semiconductor package 1 using the temperature information received from the temperature sensor 16. For example, if the temperature detected by the temperature sensor 16 is greater than or equal to a predetermined value, the controller chip 11 decreases the operation speed of the semiconductor package 1, or stops the operation of the semiconductor package 1 for a predetermined time or at predetermined intervals to control the temperature of the semiconductor package 1 to be smaller than or equal to an acceptable value.

Next, the structure of the semiconductor package 1 will be described.

Figure 4:
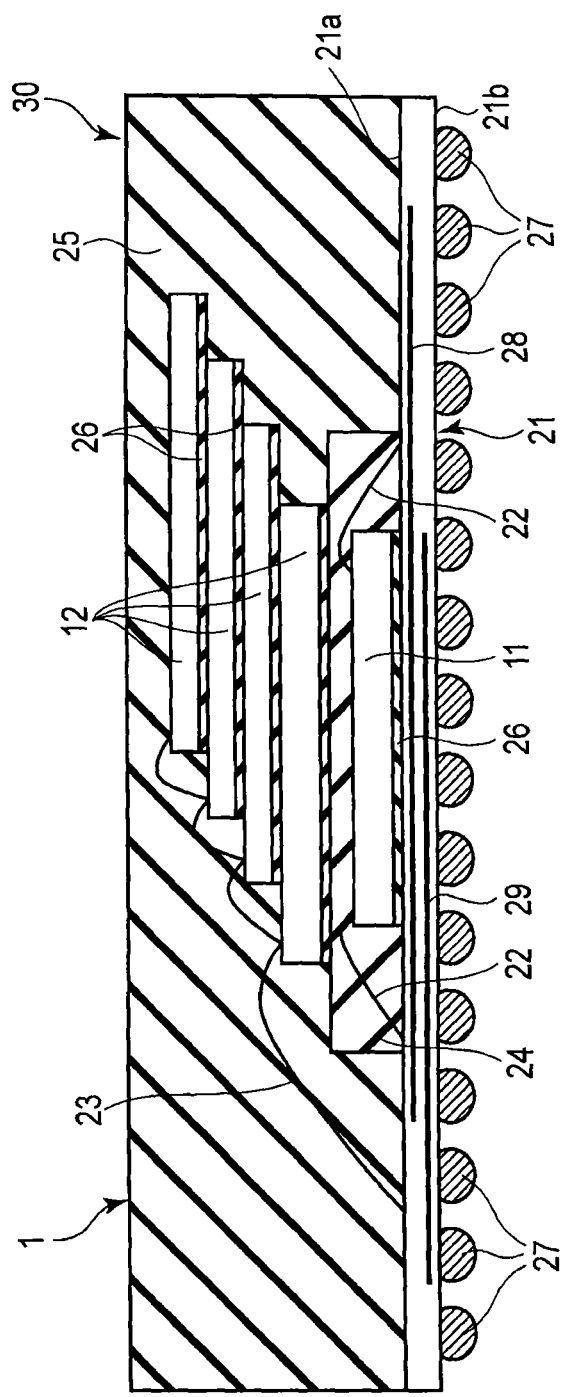
FIG. 4 is an exemplary sectional view illustrating the semiconductor package shown in FIG. 1.

FIG. 4 is a sectional view of the semiconductor package 1. The semiconductor package 1 comprises a board 21 (e.g., package board), the controller chip 11, the semiconductor memory chips 12, bonding wires 22 and 23, mold materials 24 and 25, mount films 26 and a plurality of solder balls 27.

The board 21 is a multilayered wiring board and comprises a power supply layer 28 and a ground layer 29. The board 21 comprises a first surface 21a and a second surface 21b opposite to the first surface 21a. The controller chip 11 is placed on the first surface 21a of the board 21. The controller chip 11 is fixed to the board 21 by, for example, the mount film 26. The controller chip 11 is electrically connected to the board 21 by the bonding wires 22.

The first mold material 24 for sealing the controller chip 11 and the bonding wires 22 is provided on the first surface 21a of the board 21. It should be noted that a thick mount film may be used instead of the first mold material 24. A semiconductor package (i.e., first mold package) of a mold type for sealing the controller chip 11 is formed in the above manner.

As shown in FIG. 4, a plurality of semiconductor memory chips 12 are laminated on the first mold material 24. The plurality of semiconductor memory chips 12 are fixed on the first mold material 24 by the mount films 26. The plurality of semiconductor memory chips 12 are electrically connected to the board 21 through the bonding wires 23. The semiconductor memory chip 12s are electrically connected to the controller chip 11 through the board 21.

The second mold material 25 for sealing the first mold material 24, the plurality of semiconductor memory chips 12 and the bonding wires 23 is provided on the first surface 21a of the board 21. As shown above, in this embodiment, a sealing portion 30 provided on the first surface 21a of the board 21 is formed by the first mold material 24 and the second mold material 25. The sealing portion 30 integrally covers the controller chip 11, the plurality of semiconductor memory chips 12, the oscillator 14, the EEPROM 15 and the temperature sensor 16.

FIG. 5 illustrates a first modification of the semiconductor package 1 according to this embodiment. In the first modification, the DRAM chip 13 is mounted on the first surface 21a of the board 21. The DRAM chip 13 is covered with the first mold material 24. It should be noted that the DRAM chip 13 may be located outside the first mold material 24 and covered with the second mold material 25.

Figure 6:
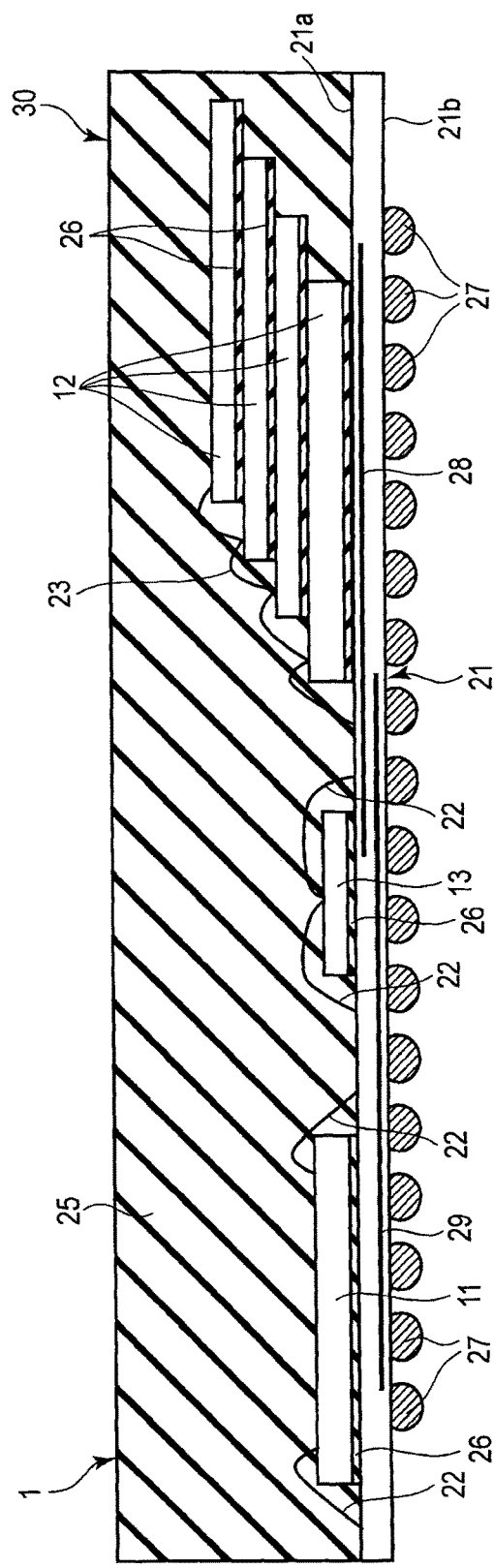
FIG. 6 is an exemplary sectional view illustrating a second modification of the semiconductor package shown in FIG. 1.

FIG. 6 illustrates a second modification of the semiconductor package 1 according to this embodiment. In the second modification, the plurality of semiconductor memory chips 12 are laminated on the first surface 21a of the board 21. That is, the plurality of semiconductor memory chips 12 are placed beside the controller chip 11 and the DRAM chip 13.

In this modification, a mold material 25 integrally covers the controller chip 11, the DRAM chip 13 and the plurality of semiconductor memory chips 12. In this case, the sealing portion 30 provided on the first surface 21a of the board 21 is formed by the mold material 25. It should be noted that the sealing portion 30 of the semiconductor package 1 is not necessarily formed of a mold material, but may be formed of a ceramic material or other materials.

Next, a plurality of solder balls 27 provided on the board 21 will be described.

Figure 7:
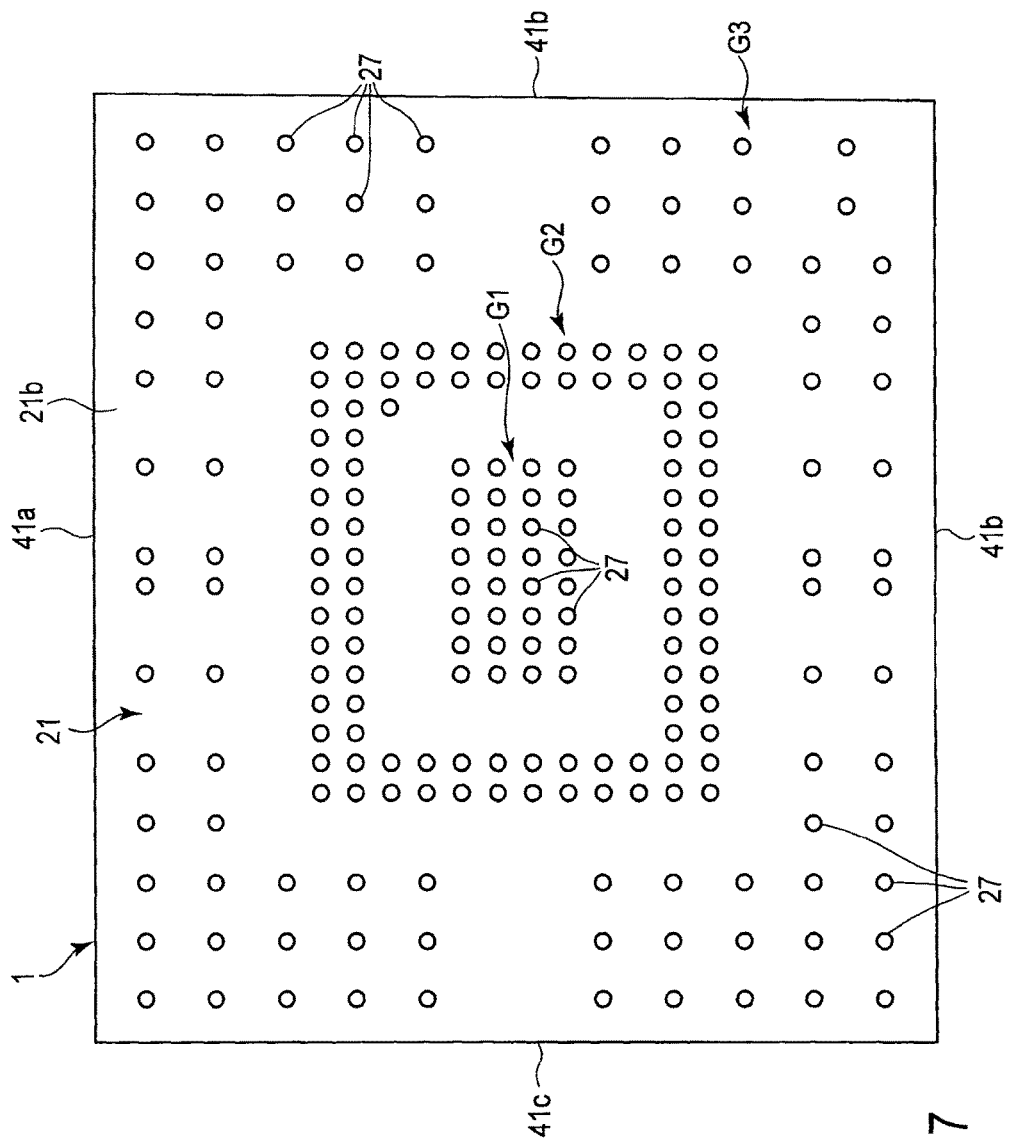
FIG. 7 is an exemplary bottom view illustrating a bottom surface of the semiconductor package shown in FIG. 1.

As shown in FIG. 4, the plurality of solder balls 27 for external connection are provided on the second surface 21b of the board 21. FIG. 7 illustrates alignment of the solder balls 27 on the second surface 21b of the board 21. As shown in FIG. 7, the plurality of solder balls 27 are not fully arranged on the whole of the second surface 21b of the board 21, but partially arranged.

Figure 10:
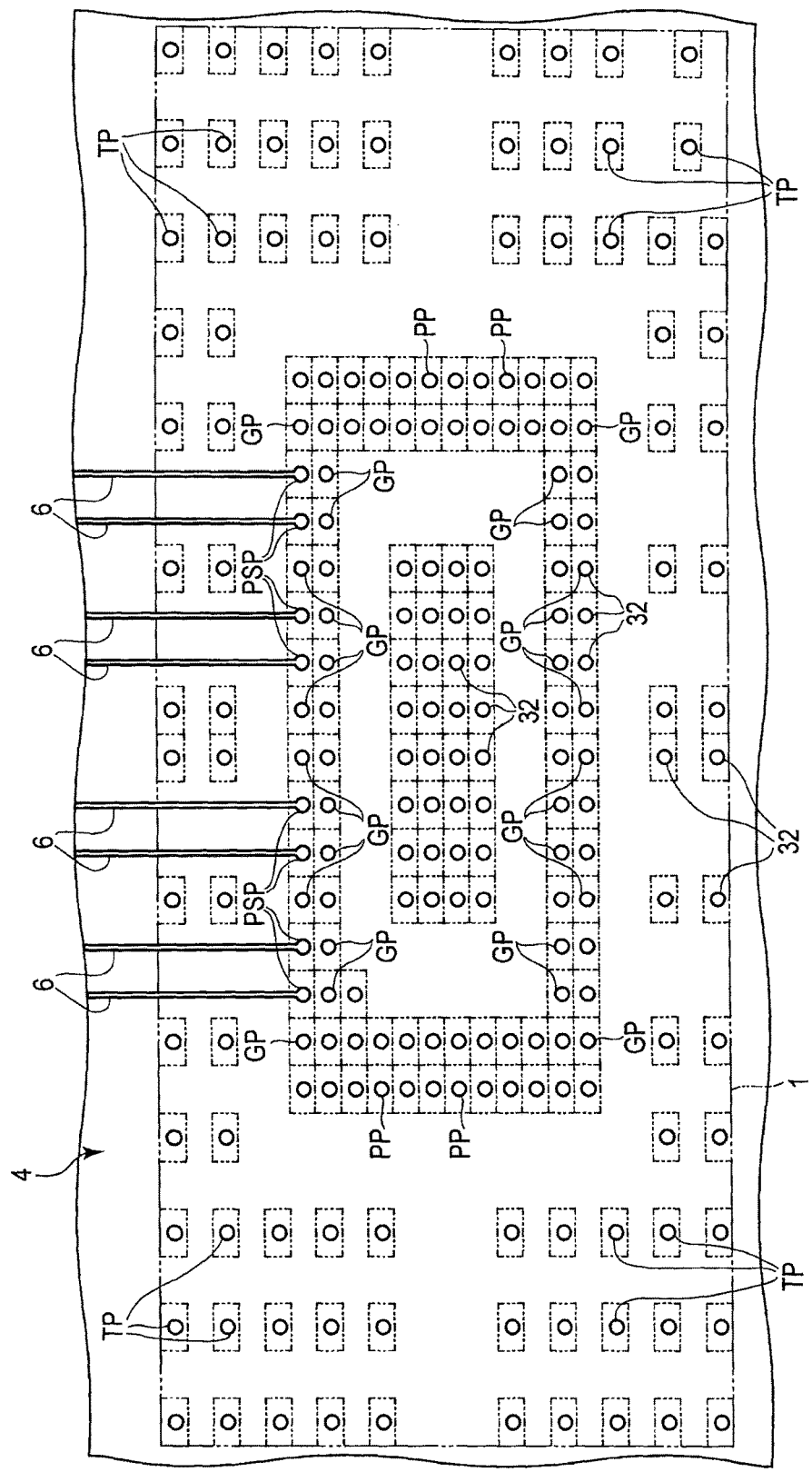
FIG. 10 is an exemplary plan view illustrating pads of a circuit board to which the solder balls shown in FIG. 7 are to be connected.

FIG. 8 schematically illustrates assignment of the solder balls 27. It should be noted that FIG. 8 illustrates ball arrangement based on a position where the balls are placed on the circuit board 4 (i.e., based on a position where the semiconductor package 1 is viewed from the above) for convenience of explanation. FIG. 9 illustrates contents of the assignment shown in FIG. 8. FIG. 10 illustrates pads 32 on the circuit board 4 to which the solder balls 27 are to be connected.

The plurality of solder balls 27 according to this embodiment include PCIe signal balls PS1, PS2, PS3, PS4, PS5, PS6, PS7 and PS8, other signal balls S, power supply balls P, ground balls G and thermal balls T (i.e., heat radiation balls).

It should be noted that in FIG. 8, the signal balls S are denoted by hatching, the power supply balls P are denoted by "Power," the ground balls G are denoted by "GND" and the thermal balls T are denoted by "T_pad." The arrangement of the solder balls 27 will be hereinafter described in detail.

As shown in FIG. 8, the plurality of solder balls 27 are divided into a first group G1, a second group G2 and a third group G3 and arranged. The first group G1 is located in the central portion of the board 21. The first group G1 comprises the thermal balls T provided in the central portion of the board 21, the power supply balls P, the ground balls G and the signal balls, which are arranged to surround the thermal balls T.

The thermal balls T (i.e., heat radiation balls) are electrically connected to the ground layer 29 or the power supply layer 28 (i.e., copper layer) of the board 21. Thus, heat of the controller chip 11, etc., easily moves to the thermal balls T through the ground layer 29 or the power supply layer 28.

The thermal balls T release part of the heat of the semiconductor package 1 to the circuit board 4. For example, in this embodiment, the controller chip 11 is located in the central portion of the board 21, and overlaps the thermal balls T of the first group G1. The controller chip 11 generates large heat during operation in comparison with other components (e.g., semiconductor memory chip 12 or DRAM chip 13). The thermal balls T of the first group G1 release part of the heat conducted to the board 21 from the controller chip 11 to the circuit board 4.

The power supply balls P are electrically connected to the power supply layer 28 of the board 21, and supply various power sources to the semiconductor package 1. The ground balls G are electrically connected to the ground layer 29 of the board 21, and become a ground potential.

As shown in FIG. 8, the second group G2 is arranged in a frame shape to surround the first group G1. A gap is present between the second group G2 and the first group G1. The second group G2 comprises the PCIe signal balls PS1, PS2, PS3, PS4, PS5, PS6, PS7 and PS8, the signal balls S, the power supply balls P and the ground balls G.

The PCIe signal balls PS1, PS2, PS3, PS4, PS5, PS6, PS7 and PS8 will be described in detail. As shown in FIGS. 8 and 9, the first PCIe signal ball PS1 corresponds to a PCIe high-speed differential signal (output, positive) of a first set. The second PCIe signal ball PS2 corresponds to a PCIe high-speed differential signal (output, negative) of the first set. The first and second PCIe signal balls PS1 and PS2 become a differential pair through which a first differential signal flows.

Similarly, the third PCIe signal ball PS3 corresponds to a PCIe high-speed differential signal (input, positive) of the first set. The fourth PCIe signal ball PS4 corresponds to a PCIe high-speed differential signal (input, negative) of the first set. The third and fourth PCIe signal balls PS3 and PS4 become a differential pair through which a second differential signal flows.

Then, the four PCIe signal balls PS1, PS2, PS3 and PS4 form a first solder ball set BS1 (i.e., first lane) corresponding to a first set of signals comprising a pair of high-speed differential input and differential output signals.

The fifth PCIe signal ball PS5 corresponds to a PCIe high-speed differential signal (output, positive) of a second set. The sixth PCIe signal ball PS6 corresponds to a PCIe high-speed differential signal (output, negative) of the second set. The fifth and sixth PCIe signal balls PS5 and PS6 become a differential pair through which a third differential signal flows.

The seventh PCIe signal ball PS7 corresponds to a PCIe high-speed differential signal (input, positive) of the second set. The eighth PCIe signal ball PS8 correspond to a PCIe high-speed differential signal (input, negative) of the second set. The seventh and eighth PCIe signal balls PS7 and PS8 become a differential pair through which a fourth differential signal flows.

Then, the four PCIe signal balls PS5, PS6, PS7 and PS8 form a second solder ball set BS2 (i.e., second lane) corresponding to a second set of signals comprising a pair of high-speed differential input and differential output signals. In other words, the semiconductor package 1 according to this embodiment comprises two solder ball sets forming the PCIe lanes.

The board 21 of the semiconductor package 1 comprises four sides. The four sides include a first side 41a, a second side 41b, a third side 41c and a fourth side 41d. The first side 41a is the closest to the host controller 5 on the board 21 in a state where the semiconductor package 1 is attached to the board 21. The first side 41a is an end (i.e., edge) facing the host controller 5. The second side 41b is opposite to the first side 41a. The third side 41c and the fourth side 41d extend between the first side 41a and the second side 41b.

As indicated by the thick broken lines in FIG. 8, in this embodiment, the first and second solder ball sets BS1 and BS2 are collectively arranged around the first side 41a of the board 21. The first and second solder ball sets BS1 and BS2 are located between the first side 41a of the board 21 and the central portion of the board 21. The first and second solder ball sets BS1 and BS2 are arranged substantially parallel to the first side 41a of the board 21. Accordingly, the first and second solder ball sets BS1 and BS2 are located closer to the host controller 5 than the central portion of the board 21.

Next, the arrangement of the first to eighth PCIe signal balls PS1, PS2, PS3, PS4, PS5, PS6, PS7 and PS8 will be described in more detail. It should be noted that the PCIe signal balls are now referred to simply as solder balls for convenience of explanation.

The first solder ball set BS1 comprises the two first solder balls PS1 and PS2 corresponding to a first differential output signal, and the two second solder balls PS3 and PS4 corresponding to a first differential input signal. In this embodiment, the first solder balls PS1 and PS2 and the second solder balls PS3 and PS4 are arranged in a line substantially parallel to the first side 41a of the board 21.

Similarly, the second solder ball set BS2 comprises the two first solder balls PS5 and PS6 corresponding to a second differential output signal, and the two second solder balls PS7 and PS8 corresponding to a second differential input signal. In this embodiment, the first solder balls PS5 and PS6 and the second solder balls PS7 and PS8 are arranged in a line substantially parallel to the first side 41a of the board 21.

As shown in FIG. 10, the plurality of pads 32 on the circuit board 4 are provided in accordance with the arrangement of the plurality of solder balls 27. The plurality of pads 32 include eight PCIe pads PSP to which the PCIe signal balls PS1, PS2, PS3, PS4, PS5, PS6, PS7 and PS8 are connected and in which PCIe signals flow through the host controller 5.

The circuit board 4 comprises the eight signal lines 6 (i.e., wiring patterns) configured to electrically connect the PCIe pads PSP and the host controller 5. The signal lines 6 are provided on, for example, a surface layer of the circuit board 4.

The signal lines 6 linearly extend toward the host controller 5 from the PCIe pads PSP. The signal lines 6 extend in a direction substantially orthogonal to the first side 41a of the board 21 of the semiconductor package 1. The eight signal lines 6 have, for example, the same wiring length. That is, isometric properties of the signal lines 6 are secured between the host controller 5 and the eight PCIe signal balls PS1, PS2, PS3, PS4, PS5, PS6, PS7 and PS8.

As shown in FIG. 8, the second group G2 of the solder balls 27 includes the plurality of ground balls G arranged around the PCIe signal balls PS1, PS2, PS3, PS4, PS5, PS6, PS7 and PS8. The ground balls G are provided between the first solder ball set BS1 and the second solder ball set BS2, between the first solder balls PS1 and PS2 and the second solder balls PS3 and PS4 in the first solder ball set BS1, and between the first solder balls PS5 and PS6 and the second solder balls PS7 and PS8 in the second solder ball set BS2.

Consequently, the first differential input signal, the first differential output signal, the second differential input signal and the second differential output signal are electrically shielded to be independent of each other, and mutual interference of signals and influence of external noise are controlled.

Also, some of the ground balls G face the PCIe signal balls PS1, PS2, PS3, PS4, PS5, PS6, PS7 and PS8 from the opposite side to the signal lines 6. Accordingly, the above-described four differential signals are electrically shielded to be independent from other signals, and the mutual interference of signals and the influence of external noise are controlled.

As shown in FIG. 8, the third group G3 of the solder balls 27 includes the plurality of thermal balls T. The third group G3 is located further outside the second group G2. The third group G3 is located between the second group G2 and an outer peripheral edge of the board 21 (four sides 41a, 41b, 41c and 41d). That is, the plurality of thermal balls T are located closer to the outer peripheral edge of the board 21 than the first and second solder ball sets BS1 and BS2.

The thermal balls T are arranged away from an area aligned with the solder ball sets BS1 and BS2 in the direction substantially orthogonal to the first side 41a of the board 21 between the first side 41a of the board 21 and the solder ball sets BS1 and BS2. That is, the thermal balls T are arranged away from an area through which the signal lines 6 pass. Accordingly, the signal lines 6 can linearly extend toward the surface layer of the circuit board 4 without being interrupted by the thermal balls T.

In another viewpoint, the thermal balls T are arranged in an area aligned in the direction substantially orthogonal to the first side 41a of the board 21 relative to the ground balls G which are located between the PCIe signal balls PS1, PS2, PS3, PS4, PS5, PS6, PS7 and PS8. The thermal balls T are located between the plurality of signal lines 6 and on the both sides of the signal lines 6. The thermal balls T are electrically connected to, for example, the ground layer 29 of the board 21, and contribute to controlling the mutual interference of signals flowing through the signal lines 6 and the influence of external noise as an electric shield.

As shown in FIGS. 7 and 8, the board 21 comprises a first area 43a and a second area 43b. The first area 43a is an area located inside the second group G2 of the solder balls 27. The first area 43a is an area closer to the central portion of the board 21 than the solder ball sets BS1 and BS2.

On the other hand, the second area 43b is an area located outside the second group G2 of the solder balls 27. The second area 43b is an area of the board 21, located in an outer peripheral area from the solder ball sets BS1 and BS2. Then, the arrangement density of the thermal balls T in the second area 43b is higher than that of the thermal balls T in the first area 43a. It should be noted that the arrangement density is a value obtained by dividing the number of thermal balls T arranged in each area by dimensions of each area.

As shown in FIG. 10, the pads 32 on the circuit board 4 include thermal pads TP to which the thermal balls T are connected. The thermal pads TP are connected to, for example, a ground layer or a power supply layer (i.e., copper layer) of the circuit board 4. It should be noted that the thermal balls T or the thermal pads TP are not necessarily limited to those connected to the ground layer or the power supply layer of the board 21 or the ground layer or the power supply layer of the circuit board 4. A heat radiation effect can be obtained to some extent also by the thermal balls T or the thermal pads TP which are not connected to the copper layer.

Next, the arrangement of the power supply balls P and the ground balls G will be described.

As shown in FIG. 8, the plurality of power supply balls P are arranged substantially point-symmetrically with respect to the center of the board 21. The plurality of ground balls G are arranged substantially point-symmetrically with respect to the center of the board 21. It should be noted that being substantially point-symmetrically includes not only the case of being completely point-symmetrical but the case where, for example, a small number of ground balls G (for example, one ground ball G) are not arranged point-symmetrically.

In another viewpoint, it is sufficient that either the plurality of power supply balls P or the plurality of ground balls G be arranged point-symmetrically with respect to the center of the board 21. In this embodiment, the plurality of power supply balls P are arranged point-symmetrically with respect to the center of the board 21.

As shown in FIG. 10, the pads 32 of the circuit board 4 include power supply pads PP to which the power supply balls P are connected and ground pads GP to which the ground balls G are connected.

By arranging the plurality of power supply balls P substantially point-symmetrically and the plurality of ground balls G substantially point-symmetrically, the correspondence relation between the power supply balls P and the power supply pads PP and that between the ground balls G and the ground pads GP are able to be maintained even if the semiconductor package 1 is erroneously rotated by 180 degrees relative to a regular direction and attached to the circuit board 4.

Next, the arrangement of the temperature sensor 16 will be described.

Figure 11:
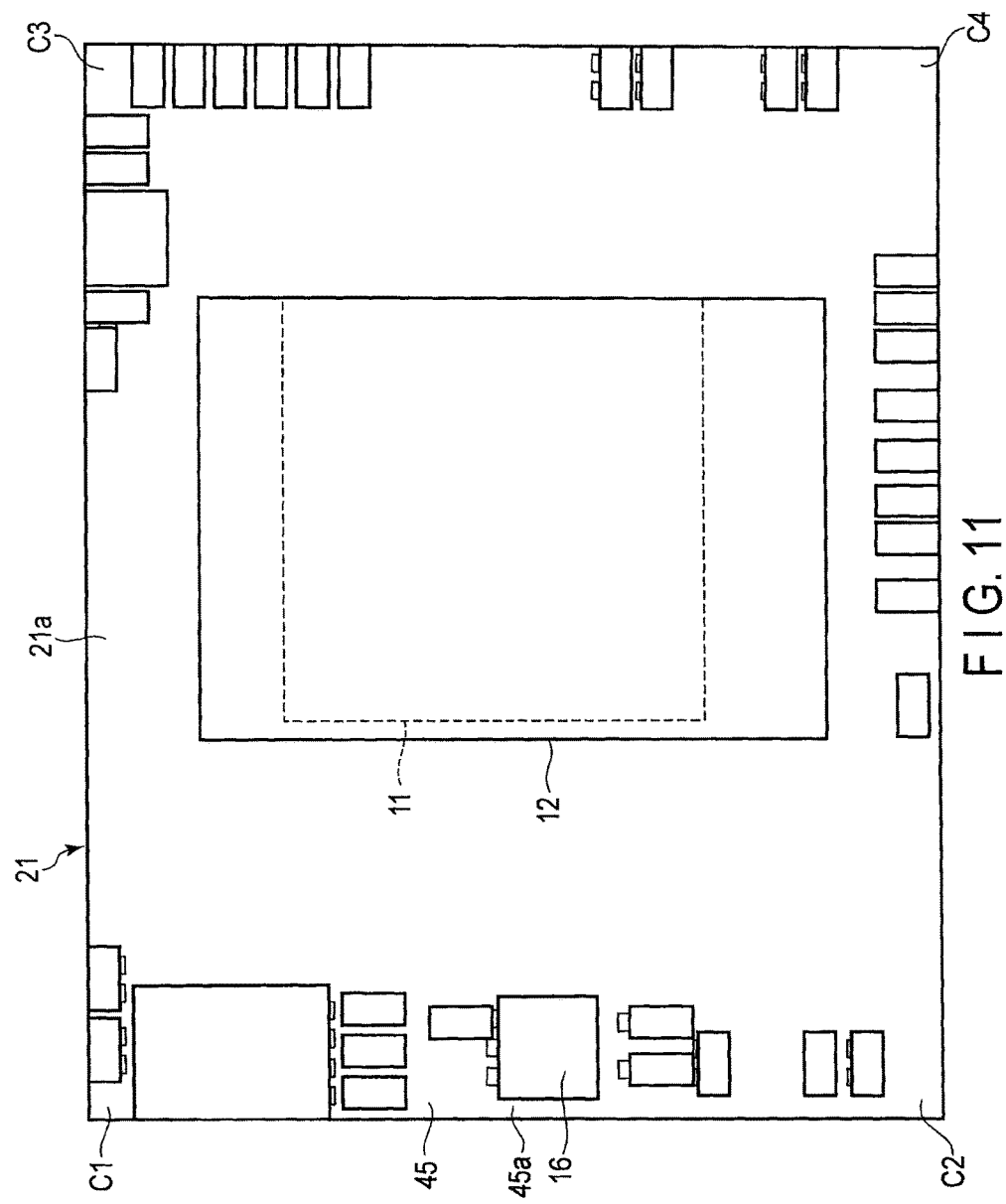
FIG. 11 is an exemplary plan view illustrating arrangement of components of the semiconductor package shown in FIG. 1.

As shown in FIG. 11, the board 21 comprises four corner portions C1, C2, C3 and C4. The temperature sensor 16 is arranged along an end 45 (i.e., edge) of the board 21 extending between corner portion C1 and corner portion C2. The end 45 comprises a central portion 45a located at the center between corner portion C1 and corner portion C2. The temperature sensor 16 is located closer to the central portion 45a of the end 45 than to corner portion C1 or corner portion C2. In this embodiment, the temperature sensor 16 is arranged in the central portion 45a.

Since corner portions C1, C2, C3 and C4 are exposed to the outside in two directions, heat radiation is high. Thus, the temperature easily increases in the central portion 45a of the end 45 more than corner portions C1 and C2 during operation of the semiconductor package 1. Thus, the detection accuracy of the temperature sensor 16 can be increased by arranging the temperature sensor 16 to bring it near the central portion 45a.

According to such a structure, the semiconductor package 1 in which high-speed operation is improved can be provided. That is, if, for example, only one solder ball set corresponds to the high-speed signal, the high-speed operation will be limited.

Then, the semiconductor package 1 according to this embodiment comprises the sealing portion 30 provided on the first surface 21a of the board 21, the controller chip 11 covered with the sealing portion 30, a semiconductor chip (e.g., the semiconductor memory chip 12) electrically connected to the controller chip 11 and covered with the sealing portion 30, and the plurality of solder balls 27 provided on the second surface 21b of the board 21. The plurality of solder balls 27 includes the plurality of solder ball sets BS1 and BS2 each corresponding to a pair of differential input and differential output signals, and the plurality of solder ball sets BS1 and BS2 are arranged substantially parallel to the first side 41a of the board 21.

According to such a structure, the amount of data which can be transmitted and received can be doubled by increasing the solder ball sets BS1 and BS2 corresponding to the high-speed signals. As a result, the high-speed operation can be improved. Furthermore, if the solder ball sets BS1 and BS2 are arranged substantially parallel to the first side 41a of the board 21, the wiring length of the signal lines 6 between the solder ball sets BS1 and BS2 and the host controller 5 can be reduced by directing the first side 41a of the board 21 toward the host controller 5 and arranging the semiconductor package 1. Accordingly, the high-speed operation of the semiconductor package 1 can be further improved.

Furthermore, if the solder ball sets BS1 and BS2 are arranged substantially parallel to the first side 41a of the board 21, the isometric properties of the signal lines 6 between the solder ball sets BS1 and BS2 and the host controller 5 can be easily secured. Accordingly, the quality of signals transmitted and received by the semiconductor package 1 can be improved.

In this embodiment, each of the solder ball sets BS1 and BS2 includes the first solder balls corresponding to the differential output signal and the second solder balls corresponding to the differential input signal. The first solder balls and the second solder balls are arranged substantially parallel to the first side 41a of the board 21. As a result, the wiring length of the signal lines 6 between both of the first solder balls and the second solder balls and the host controller 5 can be reduced by directing the first side 41a of the board 21 toward the host controller 5 and arranging the semiconductor package 1. Accordingly, the high-speed operation of the semiconductor package 1 can be further improved.

In this embodiment, each of the solder ball sets BS1 and BS2 includes two first solder balls corresponding to the differential output signal and two second solder balls corresponding to the differential input signal. The two first solder balls and the two second solder balls are arranged substantially parallel to the first side 41a of the board in each of the solder ball sets BS1 and BS2.

According to such a structure, the isometric properties of the signal lines 6 of the two first solder balls and those of the signal lines 6 of the two second solder balls, each of the two first solder balls and the two second solder balls being a differential pair, can be improved. Accordingly, the quality of signals transmitted and received by the semiconductor package 1 can be improved.

In this embodiment, the solder balls 27 include the ground ball G located between the plurality of solder ball sets BS1 and BS2 and electrically connected to the ground layer 29 of the board 21. According to such a structure, the solder ball sets BS1 and BS2 are electrically shielded by the ground balls G. Accordingly, the mutual interference of signals of the solder ball sets BS1 and BS2 and the influence of external noise can be reduced, and the signal quality can be improved.

In this embodiment, the plurality of solder balls 27 include the plurality of thermal balls T electrically connected to the ground layer 29 or the power supply layer 28 of the board 21. According to such a structure, heat of the semiconductor package 1 can be effectively released to the circuit board 4. Accordingly, the increase in temperature of the semiconductor package 1 can be suppressed, and the high-speed operation of the semiconductor package 1 can be accelerated.

In this embodiment, the plurality of thermal balls T are located closer to the outer peripheral edge of the board 21 than the plurality of solder ball sets BS1 and BS2. According to such a structure, the thermal balls T can be arranged by effectively utilizing a peripheral portion with sparse wiring layout of the board 21. Accordingly, flexibility of layout design of the semiconductor package 1 can be improved.

In this embodiment, the plurality of thermal balls T are arranged in an area between the first side 41a of the board 21 and the solder ball sets BS1 and BS2 away from an area aligned with each of the solder ball sets BS1 and BS2 in the direction substantially orthogonal to the first side 41a of the board 21. Thus, the signal lines 6 can be linearly drawn from pads PSP of the circuit board 4. That is, the signal lines 6 do not need to be bypassed to avoid the thermal balls T. Consequently, the signal quality can be further improved.

In this embodiment, the board 21 includes the first area 43a closer to the central portion of the board 21 than the plurality of solder ball sets BS1 and BS2 and the second area 43b located on an outer peripheral area from the plurality of solder ball sets BS1 and BS2. The arrangement density of the plurality of thermal balls T in the second area 43b is higher than that of the plurality of thermal balls T in the first area 43a.

According to such a structure, the thermal balls T can be arranged by effectively utilizing the peripheral portion with sparse wiring layout of the board 21. That is, since various power supply balls P or signal balls S are arranged in the central portion of the board 21, the wiring layout easily becomes dense. Then, in this embodiment, a relatively-large number of thermal balls T are arranged in the second area 43b of the board 21. Accordingly, the flexibility of layout design of the semiconductor package 1 can be improved.

It should be noted that the thermal balls T should not be fully provided on the whole surface of the board 21. It is to be desired that a necessarily and sufficiently small number of thermal balls T be provided in terms of cost reduction of the semiconductor package 1. If a limit is set on the number of thermal balls T as shown above, it is desirable to arrange a relatively-large number of thermal balls T in the second area 43b of the board 21 also in terms of heat radiation.

Figure 12:
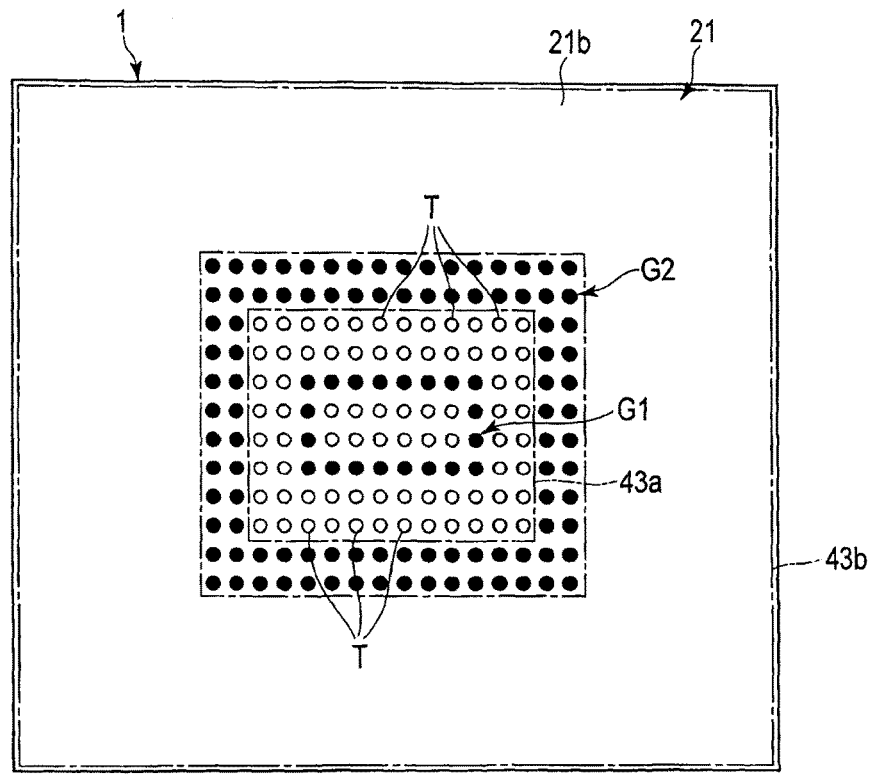
FIG. 12 is an exemplary bottom view illustrating arrangement of thermal balls of the semiconductor package.
Figure 13:
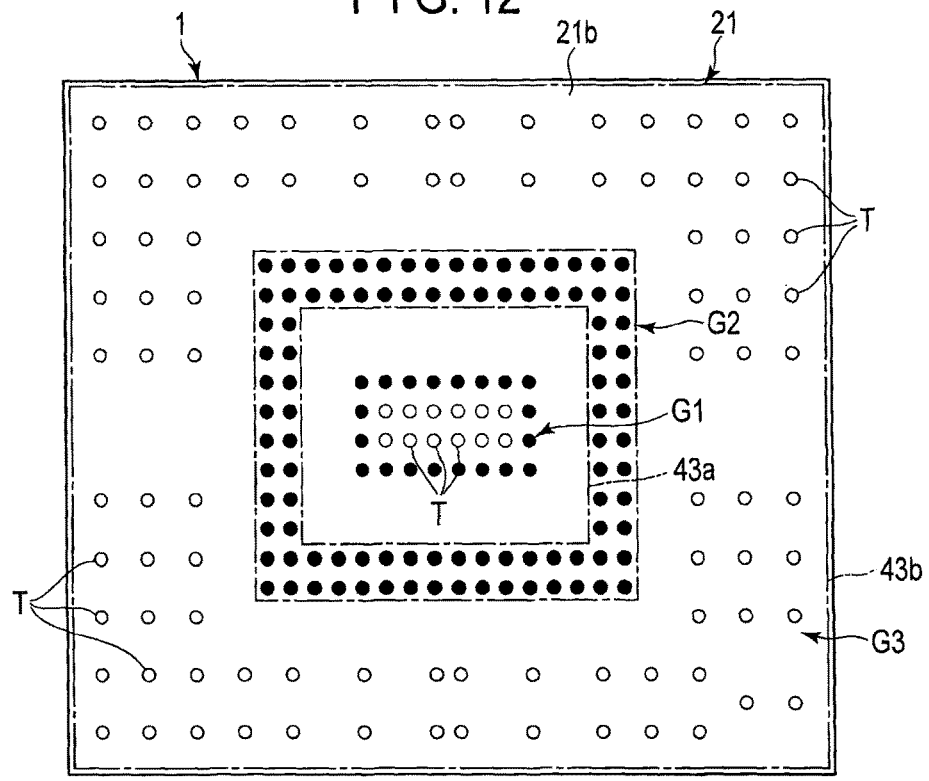
FIG. 13 is an exemplary bottom view illustrating arrangement of the thermal balls of the semiconductor package.

FIG. 12 illustrates the case where the plurality of thermal balls T are intensively arranged in the first area 43a. On the other hand, FIG. 13 illustrates the case where the thermal balls T whose number is substantially the same as that in FIG. 12 are divided into the first area 43a and the second area 43b, and the arrangement density of the thermal balls T in the second area 43b is made higher in comparison with the first area 43a.

At a glance, it appears that good heat radiation can be obtained by arranging a relatively-large number of thermal balls T in the first area 43a located directly under the controller chip 11 which is a heat generating component, as shown in FIG. 12. According to the examination results by the inventor, however, it has been proved that the temperature rise of the semiconductor package 1 can be suppressed to be low by arranging the relatively-large number of thermal balls T in the second area 43b, as shown in FIG. 13. It is considered that this is because the heat radiation of the whole of the semiconductor package 1 is improved by arranging the thermal balls T to divide them into the second area 43b as well as into the first area 43a.

In this embodiment, the plurality of solder balls 27 include the plurality of power supply balls P electrically connected to the power supply layer 28 of the board 21 and the plurality of ground balls G electrically connected to the ground layer 29 of the board 21. The plurality of power supply balls P are arranged substantially point-symmetrically with respect to the center of the board 21, and the plurality of ground balls G are arranged substantially point-symmetrically with respect to the center of the board 21.

If the plurality of power supply balls P or the plurality of ground balls G are not arranged substantially point-symmetrically, the power supply pads PP of the circuit board 4 and the ground balls G of the semiconductor package 1 may be connected and short-circuited by attaching the semiconductor package 1 to the board 21 with the package being erroneously rotated by 180 degrees relative to a regular direction.

On the other hand, if the plurality of power supply balls P are arranged substantially point-symmetrically with respect to the center of the board 21, and the plurality of ground balls G are arranged substantially point-symmetrically with respect to the center of the board 21, as in this embodiment, the correspondence relation between the plurality of power supply balls P and the plurality of power supply pads PP, and that between the plurality of ground balls G and the plurality of ground pads GP are maintained even if the semiconductor package 1 is attached to the board 21 with the package being erroneously rotated by 180 degrees relative to the regular direction. Thus, a short circuit does not occur, and damage to the whole system and the semiconductor package 1 can be prevented.

(Second Embodiment)

Next, a semiconductor package 1 according to a second embodiment will be described with reference to FIGS. 14 to 16. It should be noted that structures having functions identical or similar to those of the first embodiment will be denoted by the same reference numbers, and their detailed explanations will be omitted. Also, the structures other than those to be described below are the same as in the first embodiment.

The semiconductor package 1 according to this embodiment comprises four solder ball sets in which solder balls 27 are arranged at a pitch of, for example, 0.8 mm and which correspond to PCIe high-speed signals.

Figure 14:
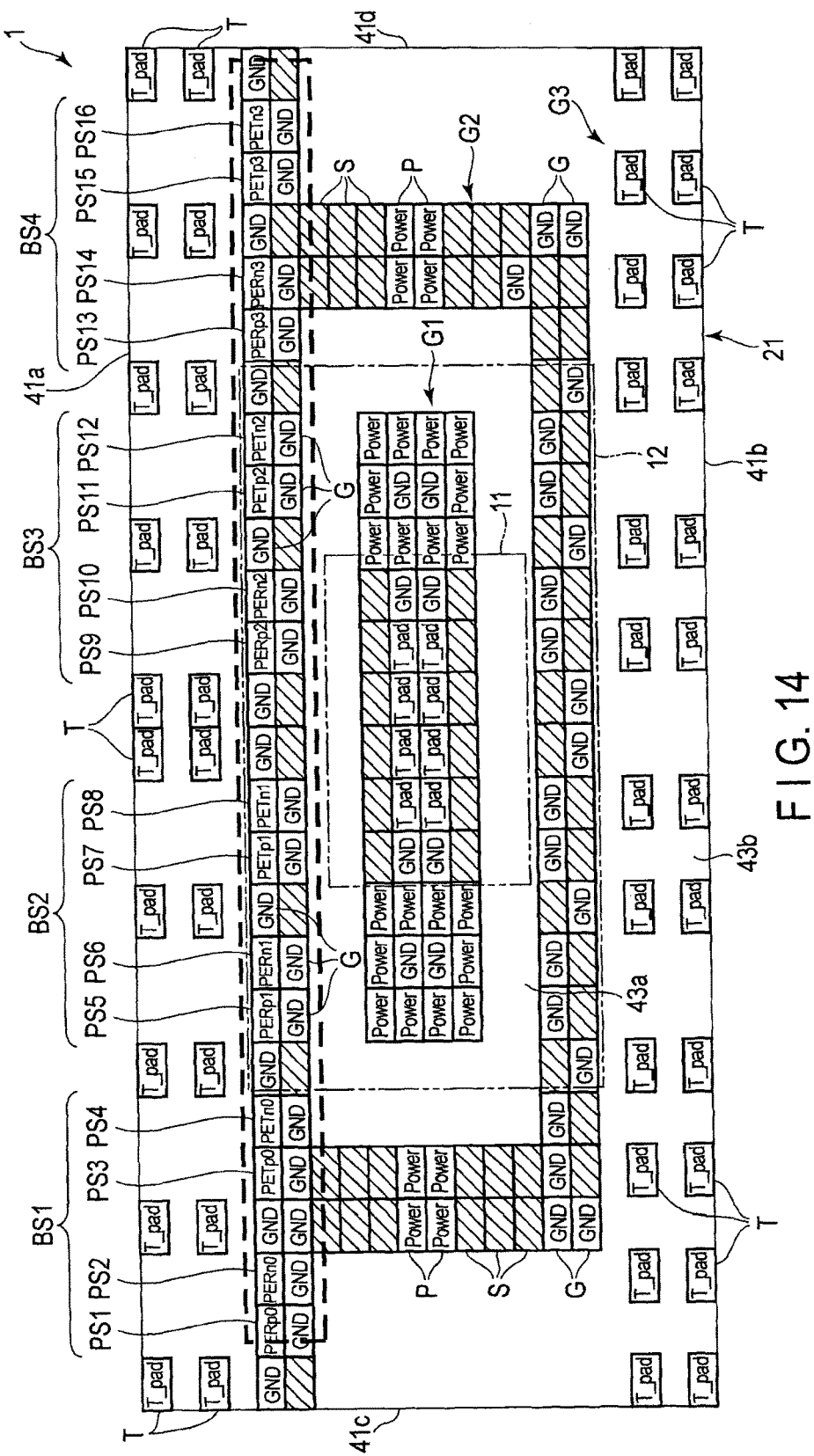
FIG. 14 illustrates, as an example, assignment of solder balls of a semiconductor package according to a second embodiment.

FIG. 14 schematically illustrates assignment of the solder balls 27 according to this embodiment. It should be noted that FIG. 14 illustrates ball arrangement based a position where the balls are placed on a circuit board 4 (i.e., based on a position where the semiconductor package 1 is viewed from the above) for convenience of explanation. FIG. 15 illustrates contents of the assignment shown in FIG. 14. FIG. 16 illustrates pads 32 on the circuit board 4 to which the solder balls 27 are to be connected. The solder balls 27 according to this embodiment include PCIe signal balls PS1 to PS16.

A first PCIe signal ball PS1 corresponds to a PCIe high-speed differential signal (input, positive) of a first set. A second PCIe signal ball PS2 corresponds to a PCIe high-speed differential signal (input, negative) of the first set. The first and second PCIe signal balls PS1 and PS2 become a differential pair through which a first differential signal flows.

A third PCIe signal ball PS3 corresponds to a PCIe high-speed differential signal (output, positive) of the first set. A fourth PCIe signal ball PS4 corresponds to a PCIe high-speed differential signal (output, negative) of the first set. The third and fourth PCIe signal balls PS3 and PS4 become a differential pair through which a second differential signal flows.

Then, the four PCIe signal balls PS1, PS2, PS3 and PS4 form a first solder ball set BS1 (i.e., first lane) corresponding to a first set of signals comprising a pair of high-speed differential input and differential output signals.

Similarly, a fifth PCIe signal ball PS5 corresponds to a PCIe high-speed differential signal (input, positive) of a second set. A sixth PCIe signal ball PS6 corresponds to a PCIe high-speed differential signal (input, negative) of the second set. The fifth and sixth PCIe signal balls PS5 and PS6 become a differential pair through which a third differential signal flows.

A seventh PCIe signal ball PS7 corresponds to a PCIe high-speed differential signal (output, positive) of the second set. A eighth PCIe signal ball PS8 corresponds to a PCIe high-speed differential signal (output, negative) of the second set. The seventh and eighth PCIe signal balls PS7 and PS8 become a differential pair through which a fourth differential signal flows.

Then, the four PCIe signal balls PS5, PS6, PS7 and PS8 form a second solder ball set BS2 (i.e., second lane) corresponding to a second set of signals comprising a pair of high-speed differential input and differential output signals.

A ninth PCIe signal ball PS9 corresponds to a PCIe high-speed differential signal (input, positive) of a third set. A tenth PCIe signal ball PS10 corresponds to a PCIe high-speed differential signal (input, negative) of the third set. The ninth and tenth PCIe signal balls PS9 and PS10 become a differential pair through which a fifth differential signal flows.

An eleventh PCIe signal ball PS11 corresponds to a PCIe high-speed differential signal (output, positive) of the third set. A twelfth PCIe signal ball PS12 corresponds to a PCIe high-speed differential signal (output, negative) of the third set. The eleventh and twelfth PCIe signal balls PS11 and PS12 become a differential pair through which a sixth differential signal flows.

Then, the four PCIe signal balls PS9, PS10, PS11 and PS12 form a third solder ball set BS3 (i.e., third lane) corresponding to a third set of signals comprising a pair of high-speed differential input and differential output signals.

A thirteenth PCIe signal ball PS13 corresponds to a PCIe high-speed differential signal (input, positive) of a fourth set.

A fourteenth PCIe signal ball PS14 corresponds to a PCIe high-speed differential signal (input, negative) of the fourth set. The thirteenth and fourteenth PCIe signal balls PS13 and PS14 become a differential pair through which a seventh differential signal flows.

A fifteenth PCIe signal ball PS15 corresponds to a PCIe high-speed differential signal (output, positive) of the fourth set. A sixteenth PCIe signal ball PS16 corresponds to a PCIe high-speed differential signal (output, negative) of the fourth set. The fifteenth and sixteenth PCIe signal balls PS15 and PS16 become a differential pair through which an eighth differential signal flows.

Then, the four PCIe signal balls PS13, PS14, PS15 and PS16 form a fourth solder ball set BS4 (i.e., fourth lane) corresponding to a fourth set of signals comprising a pair of high-speed differential input and differential output signals. In other words, the semiconductor package 1 according to this embodiment comprises four solder ball sets forming the PCIe lanes.

As indicated by the thick broken lines in FIG. 14, in this embodiment, the first to fourth solder ball sets BS1, BS2, BS3 and BS4 are collectively arranged around a first side 41a of the board 21. The first to fourth solder ball sets BS1, BS2, BS3 and BS4 are located between the first side 41a of the board 21 and the central portion of the board 21. The first to fourth solder ball sets BS1, BS2, BS3 and BS4 are arranged substantially parallel to the first side 41a of the board 21. Accordingly, the first to fourth solder ball sets BS1, BS2, BS3 and BS4 are located closer to a host controller 5 than the central portion of the board 21.

Next, the arrangement of the first to sixteenth PCIe signal balls PS1 to PS16 will be described in more detail. It should be noted that PCIe signal balls are now referred to simply as solder balls for convenience of explanation.

The first solder ball set BS1 comprises two first solder balls PS1 and PS2 corresponding to a first differential input signal, and two second solder balls PS3 and PS4 corresponding to a first differential output signal. In this embodiment, the first solder balls PS1 and PS2 and the second solder balls PS3 and PS4 are arranged in a line substantially parallel to the first side 41a of the board 21.

Similarly, the second solder ball set BS2 comprises two first solder balls PS5 and PS6 corresponding to a second differential input signal, and two second solder balls PS7 and PS8 corresponding to a second differential output signal. In this embodiment, the first solder balls PS5 and PS6 and the second solder balls PS7 and PS8 are arranged in a line substantially parallel to the first side 41a of the board 21.

The third solder ball set BS3 comprises two first solder balls PS9 and PS10 corresponding to a third differential input signal, and two second solder balls PS11 and PS12 corresponding to a third differential output signal. In this embodiment, the first solder balls PS9 and PS10 and the second solder balls PS11 and PS12 are arranged in a line substantially parallel to the first side 41a of the board 21.

The fourth solder ball set BS4 comprises two first solder balls PS13 and PS14 corresponding to a fourth differential input signal, and two second solder balls PS15 and PS16 corresponding to a fourth differential output signal. In this embodiment, the first solder balls PS13 and PS14 and the second solder balls PS15 and PS16 are arranged in a line substantially parallel to the first side 41a of the board 21.

Figure 16:
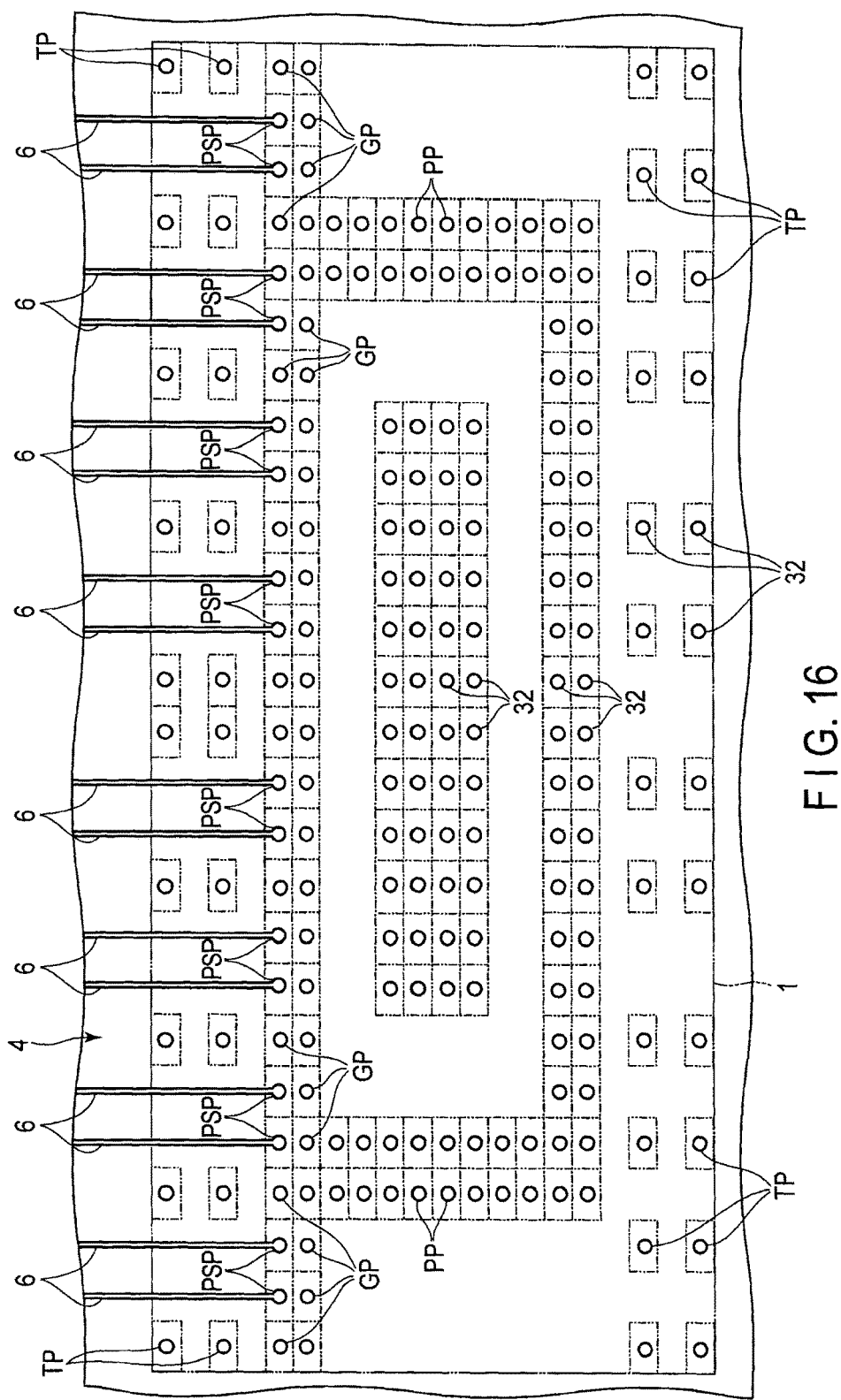
FIG. 16 is an exemplary plan view illustrating pads of a circuit board to which the solder balls shown in FIG. 14 are to be connected.

As shown in FIG. 16, the plurality of pads 32 of the circuit board 4 include 16 PCIe pads PSP to which the PCIe signal balls PS1 to PS16 are connected and in which PCIe signals flow through the host controller 5.

The circuit board 4 comprises 16 signal lines 6 (i.e., wiring patterns) configured to electrically connect the PCIe pads PSP and the host controller 5. The 16 signal lines 6 have, for example, the same wiring length. That is, isometric properties of the signal lines 6 are secured between the host controller 5 and the 16 PCIe signal balls PS1 to PS16.

As shown in FIG. 14, some of ground balls G are provided between the first to fourth solder ball sets BS1, BS2, BS3 and BS4. Also, the ground balls G are located between the first solder balls and the second solder balls in each of the solder ball sets BS1, BS2, BS3 and BS4.

According to such a structure, the semiconductor package 1 in which high-speed operation is improved can be provided as in the first embodiment. That is, this embodiment includes at least four solder ball sets each corresponding to signal sets comprising a pair of high-speed differential input and differential output signals conforming to the PCIe standard. The four solder ball sets BS1, BS2, BS3 and BS4 are located between the first side 41a of the board 21 configured to be closest to the host controller 5 and the central portion of the board 21, and the four solder ball sets BS1, BS2, BS3 and BS4 are arranged substantially parallel to the first side 41a of the board 21.

According to such a structure, the amount of data which can be transmitted and received can be further increased by increasing the solder ball sets BS1, BS2, BS3 and BS4 corresponding to the high-speed signals. As a result, the high-speed operation can be improved. Furthermore, if the solder ball sets BS1, BS2, BS3 and BS4 are arranged substantially parallel to the first side 41a of the board 21, the wiring length of the signal lines 6 between the solder ball sets BS1, BS2, BS3 and BS4 and the host controller 5 can be reduced by directing the first side 41a of the board 21 toward the host controller 5 and arranging the semiconductor package 1. Accordingly, the high-speed operation of the semiconductor package 1 can be further improved.

Also, if the solder ball sets BS1, BS2, BS3 and BS4 are arranged substantially parallel to the first side 41a of the board 21, the isometric properties of the signal lines 6 between the solder ball sets BS1, BS2, BS3 and BS4 and the host controller 5 can be easily secured. Accordingly, the quality of signals transmitted and received by the semiconductor package 1 can be improved.

In this embodiment, all of the 16 PCIe signal balls PS1 to PS16 corresponding to the PCIe high-speed signal are arranged in a line substantially parallel to the first side 41a of the board 21. As a result, the isometric properties of the wiring length of the signal lines 6 between the 16 PCIe signal balls PS1 to PS16 and the host controller 5 can be secured. Accordingly, the quality of signals to be transmitted and received by the semiconductor package 1 can be further improved.

(Third Embodiment)

Next, a semiconductor package 1 according to a third embodiment will be described with reference to FIGS. 17 and 18. It should be noted that structures having functions identical or similar to those of the first and second embodiments will be denoted by the same reference numbers, and their detailed explanations will be omitted. Also, the structures other than those to be described below are the same as in the second embodiment.

The semiconductor package 1 according to this embodiment comprises four solder ball sets in which solder balls 27 are arranged at a pitch of, for example, 0.8 mm and which correspond to PCIe high-speed signals.

Figure 17:
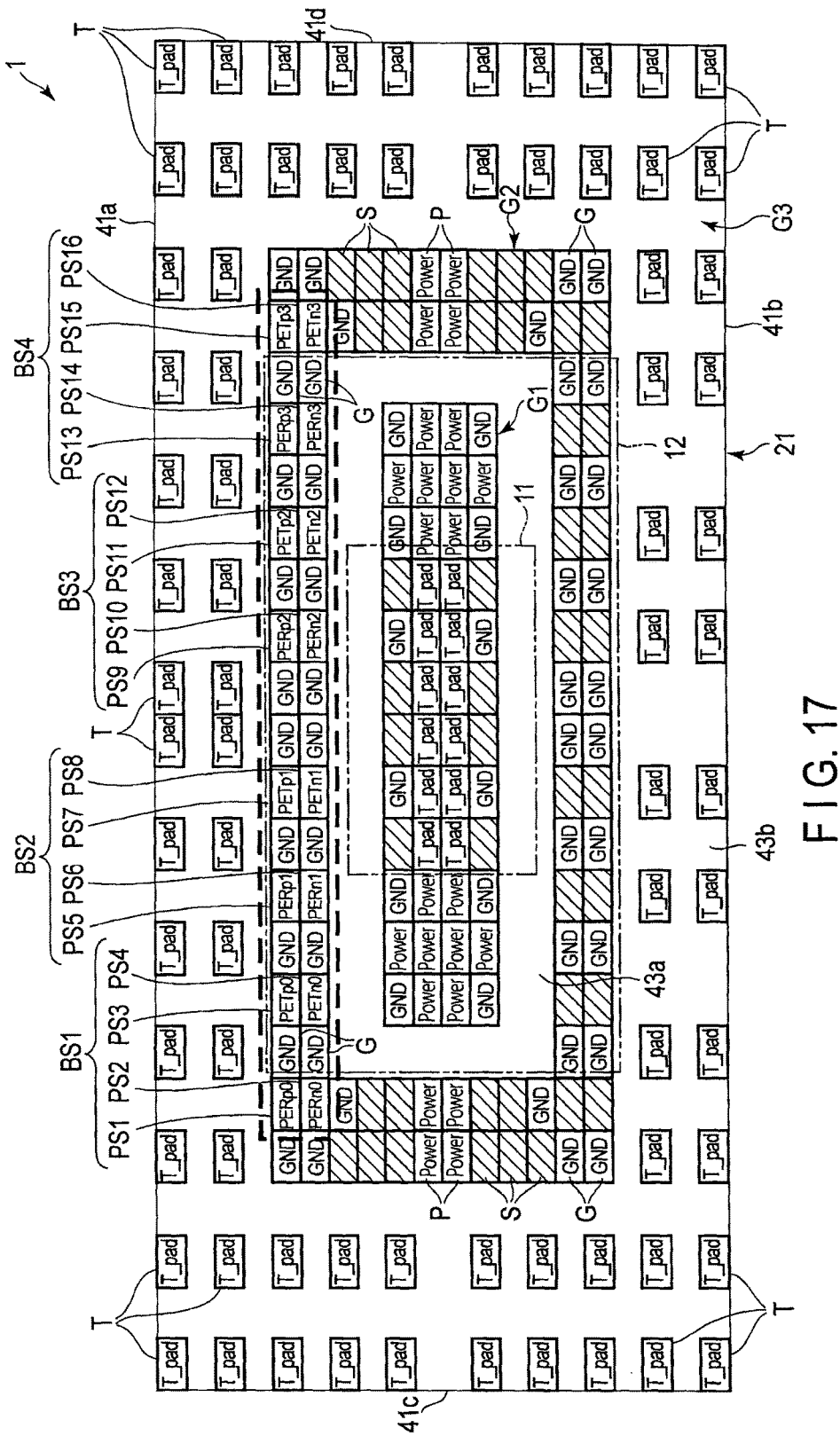
FIG. 17 illustrates, as an example, assignment of solder balls of a semiconductor package according to a third embodiment.
Figure 18:
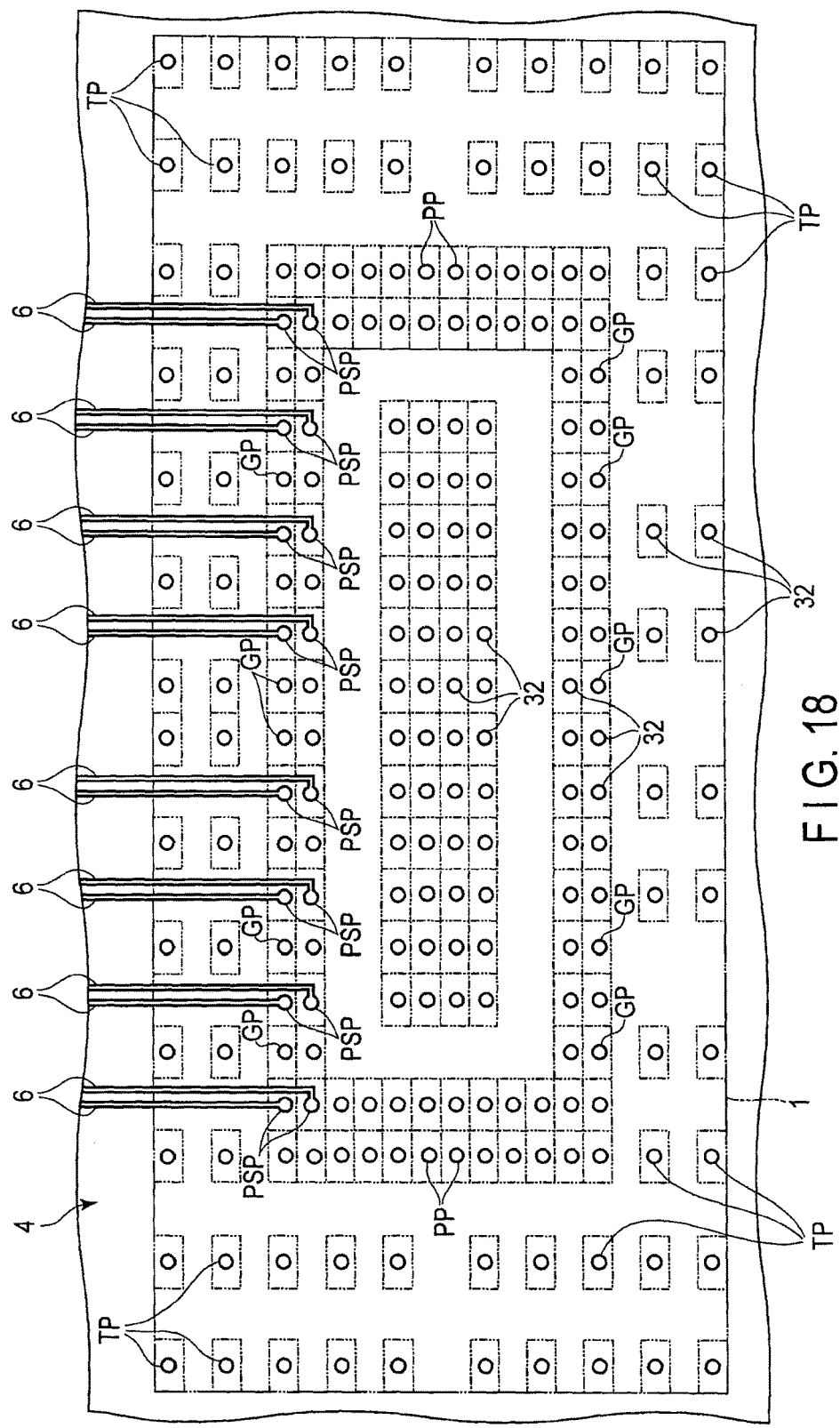
FIG. 18 is an exemplary plan view illustrating pads of a circuit board to which the solder balls shown in FIG. 17 are to be connected.

FIG. 17 schematically illustrates assignment of the solder balls 27 according to this embodiment. It should be noted that FIG. 17 illustrates ball arrangement based on a position where the balls are placed on a circuit board 4 (i.e., based on a position where the semiconductor package 1 is viewed from the above) for convenience of explanation. FIG. 18 illustrates pads 32 on the circuit board 4 to which the solder balls 27 are to be connected.

According to this embodiment, in a first solder ball set BS1, two first solder balls PS1 and PS2 corresponding to a first differential input signal are arranged in a direction substantially orthogonal to the first side 41a of the board 21. Also, two second solder balls PS3 and PS4 corresponding to a first differential output signal are arranged in the direction substantially orthogonal to the first side 41a of the board 21.

Similarly, in a second solder ball set BS2, two first solder balls PS5 and PS6 corresponding to a second differential input signal are arranged in the direction substantially orthogonal to the first side 41a of the board 21. Also, two second solder balls PS7 and PS8 corresponding to a second differential output signal are arranged in the direction substantially orthogonal to the first side 41a of the board 21.

In a third solder ball set BS3, two first solder balls PS9 and PS10 corresponding to a third differential input signal are arranged in the direction substantially orthogonal to the first side 41a of the board 21. Also, two second solder balls PS11 and PS12 corresponding to a third differential output signal are arranged in the direction substantially orthogonal to the first side 41a of the board 21.

In a fourth solder ball set BS4, two first solder balls PS13 and PS14 corresponding to a fourth differential input signal are arranged in the direction substantially orthogonal to the first side 41a of the board 21. Also, two second solder balls PS15 and PS16 corresponding to a fourth differential output signal are arranged in the direction substantially orthogonal to the first side 41a of the board 21.

As shown in FIG. 17, in this embodiment, the plurality of power supply balls P are arranged completely point-symmetrically with respect to the center of the board 21 and the plurality of ground balls G are arranged completely point-symmetrically with respect to the center of the board 21.

According to such a structure, the semiconductor package 1 in which high-speed operation is improved can be provided as in the second embodiment. That is, this embodiment includes at least four solder ball sets corresponding to signal sets each comprising a pair of high-speed differential input and differential output signals conforming to the PCIe standard. The four solder ball sets BS1, BS2, BS3 and BS4 are located between a first side 41a of the board 21 configured to be closest to a host controller 5 and the central portion of the board 21, and the four solder ball sets BS1, BS2, BS3 and BS4 are arranged substantially parallel to the first side 41a of the board 21.

It should be noted that in this embodiment, the plurality of power supply balls P are arranged point-symmetrically with respect to the center of the board 21 and the plurality of ground balls G are arranged point-symmetrically with respect to the center of the board 21.

According to such a structure, the amount of data which can be transmitted and received can be further increased by increasing the solder ball sets BS1, BS2, BS3 and BS4 corresponding to the high-speed signals. As a result, the high-speed operation can be improved. Furthermore, if the solder ball sets BS1, BS2, BS3 and BS4 are arranged substantially parallel to the first side 41a of the board 21, the wiring length of the signal lines 6 between the solder ball sets BS1, BS2, BS3 and BS4 and the host controller 5 can be reduced by directing the first side 41a of the board 21 toward the host controller 5 and arranging the semiconductor package 1. Accordingly, the high-speed operation of the semiconductor package 1 can be further improved.

Also, if the solder ball sets BS1, BS2, BS3 and BS4 are arranged substantially parallel to the first side 41a of the board 21, the isometric properties of the signal lines 6 between the solder ball sets BS1, BS2, BS3 and BS4 and the host controller 5 can be easily secured. Accordingly, the quality of signals transmitted and received by the semiconductor package 1 can be improved.

A peripheral end area of the board 21 is an area where connection reliability of the solder balls 27 may deteriorate because of, for example, thermal stress applied when the semiconductor package 1 is mounted. Thus, if the PCIe signal balls are arranged around the peripheral end area of the board 21, the connection reliability of the PCIe signal balls may deteriorate.

Then, in each of the solder ball sets BS1, BS2, BS3 and BS4 of this embodiment, each of the two first solder balls and the two second solder balls are arranged in the direction substantially orthogonal to the first side 41a of the board 21. That is, in this embodiment, two solder balls which become a differential pair are arranged to the rear and to the front, and the four solder ball sets BS1, BS2, BS3 and BS4 are arranged substantially parallel to the first side 41a of the board 21.

According to such a structure, the four solder ball sets BS1, BS2, BS3 and BS4 can be arranged apart from the peripheral end area of the board 21 in comparison with the structure of, for example, the second embodiment. Accordingly, the connection reliability of the PCIe signal balls PS1 to PS16 included in the four solder ball sets BS1, BS2, BS3 and BS4 can be improved.

Next, some modifications of the semiconductor package 1 according to this embodiment will be described.

Figure 19:
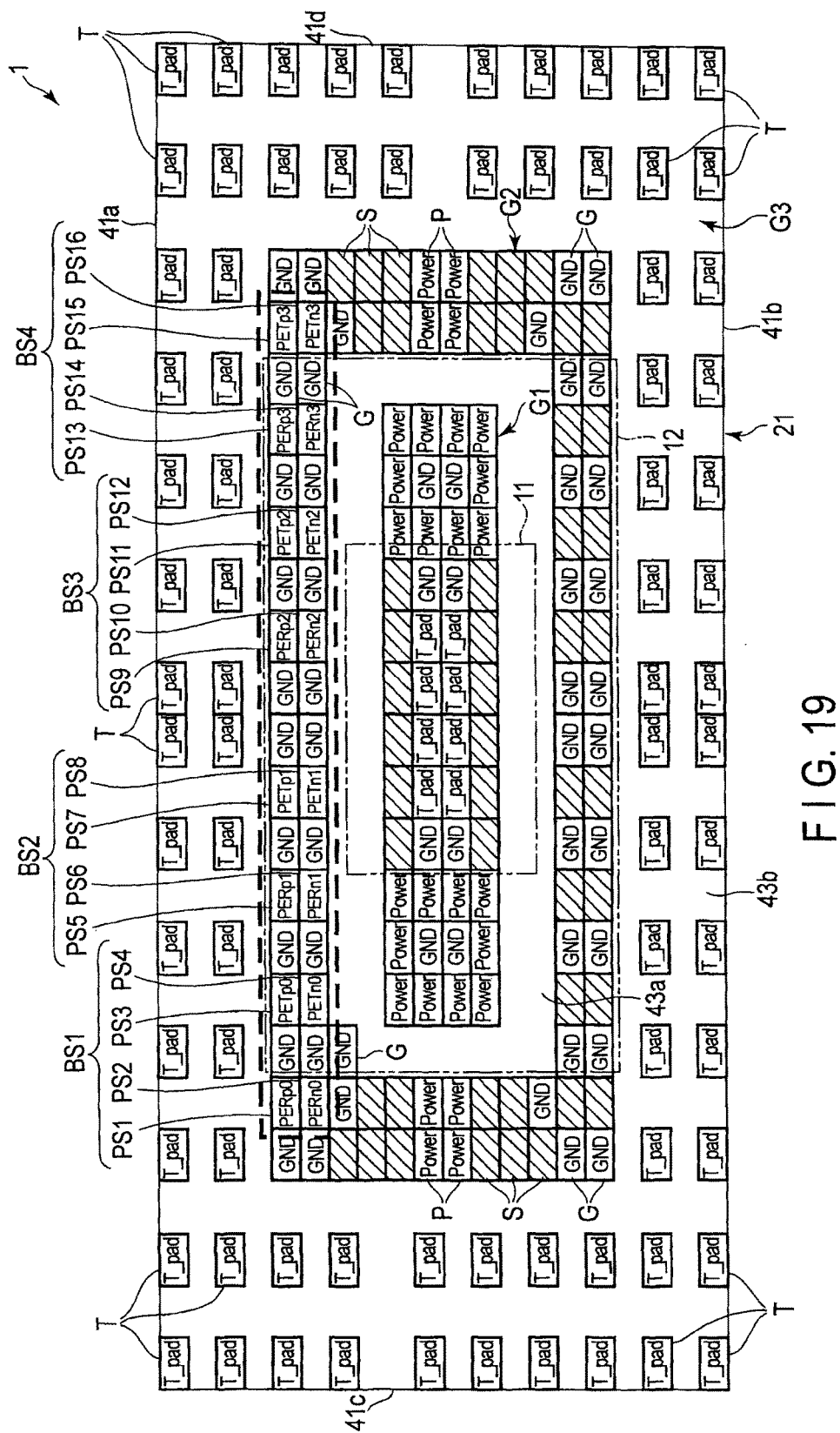
FIG. 19 illustrates, as an example, a first modification of the semiconductor package according to the third embodiment.

FIG. 19 illustrates the semiconductor package 1 according to a first modification. In this modification, the arrangement of the power supply balls P, the ground balls G and the thermal balls T of the first group G1 is changed. Accordingly, the arrangement of various solder balls 27 can be properly changed. It should be noted that the plurality of power supply balls P are arranged point-symmetrically with respect to the center of the board 21 and the plurality of ground balls G are arranged point-symmetrically with respect to the center of the board 21 also in this modification.

Figure 20:
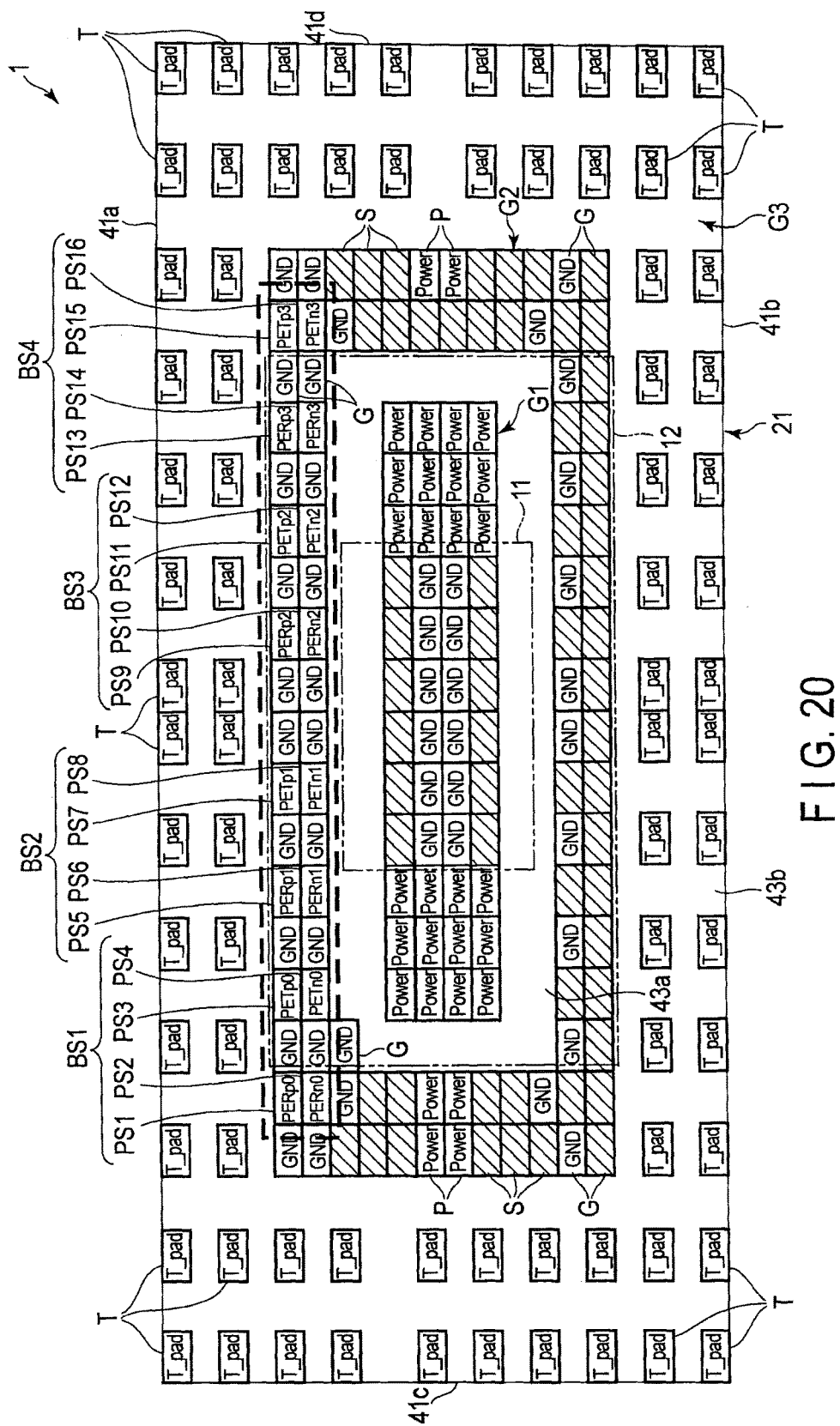
FIG. 20 illustrates, as an example, a second modification of the semiconductor package according to the third embodiment.

FIG. 20 illustrates the semiconductor package 1 according to the second modification. In this modification, the arrangement of the power supply balls P, the ground balls G and the thermal balls T of the first group G1 is changed. It should be noted that the plurality of power supply balls P are arranged point-symmetrically with respect to the center of the board 21 and the plurality of ground balls G are arranged point-symmetrically with respect to the center of the board 21 also in this alternate embodiment.

FIG. 21 illustrates the semiconductor package 1 according to a third modification. In this modification, plate heat radiators 51 are provided instead of some thermal balls T. The heat radiator 51 is formed of, for example, metal, and electrically connected to the ground layer 29 or the power supply layer 28 of the board 21. Pads in a shape corresponding to the plate heat radiators 51 are provided on the circuit board 4. According to such a structure, the heat radiation of the semiconductor package 1 can be further improved.

Figure 22:
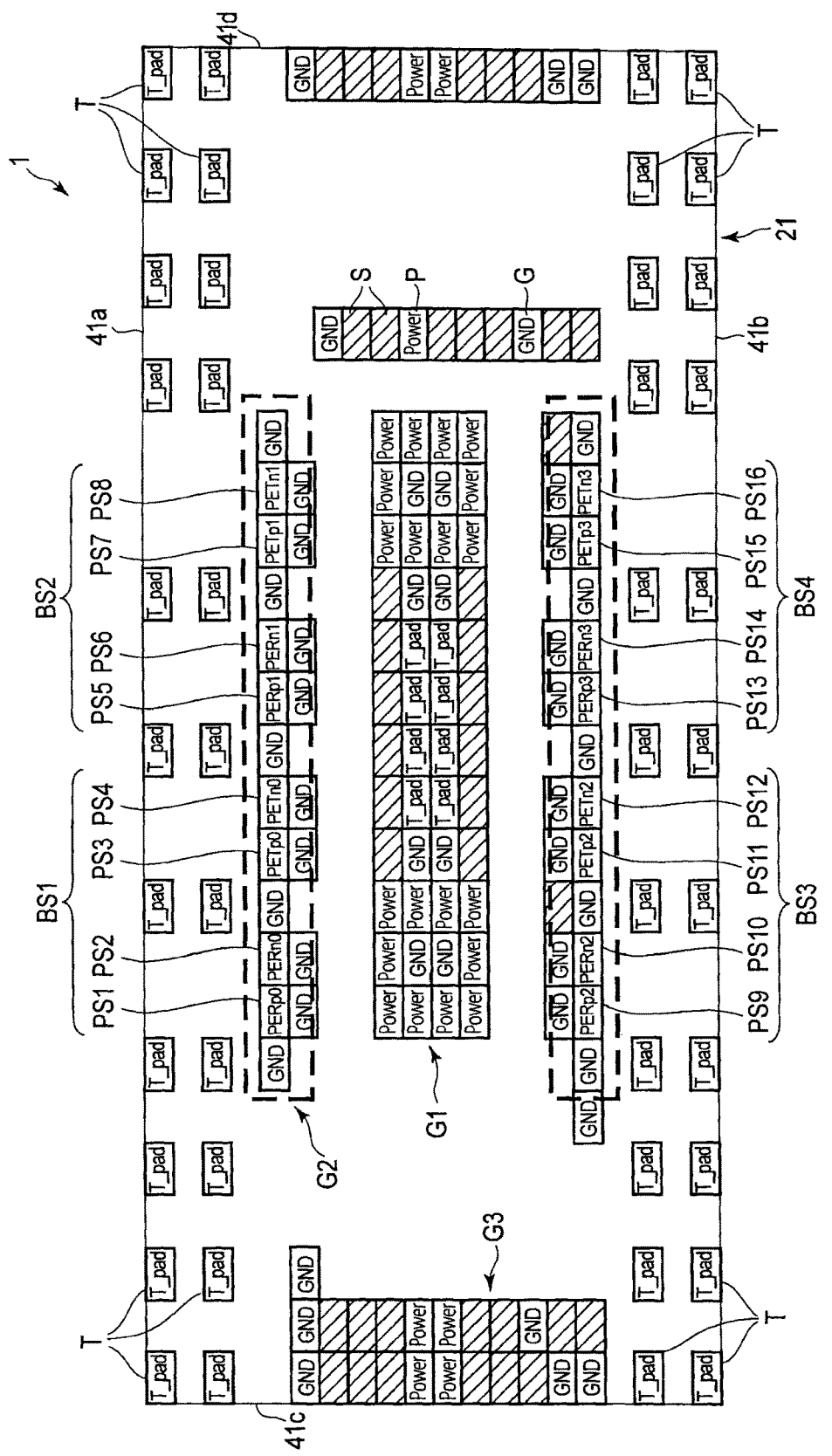
FIG. 22 illustrates, as an example, a fourth modification of the semiconductor package according to the third embodiment.

FIG. 22 illustrates the semiconductor package 1 according to a fourth modification. In this modification, the four solder ball sets BS1, BS2, BS3 and BS4 are divided into two sides of the frame-shaped second group G2 and arranged. That is, the two solder ball sets BS1 and BS2 are located between the first side 41a of the board 21 and the central portion of the board 21, and arranged substantially parallel to the first side 41a of the board 21. On the other hand, the other two sets, i.e., the solder ball sets BS3 and BS4 are located between the second side 41b of the board 21 and the central portion of the board 21, and arranged substantially parallel to the second side 41b of the board 21.

The four solder ball sets BS1, BS2, BS3 and BS4 can be arranged apart from the peripheral end area of the board 21 also in such a structure, in comparison with the structure of, for example, the second embodiment. Accordingly, the connection reliability of the PCIe signal balls PS1 to PS16 included in the four solder ball sets BS1, BS2, BS3 and BS4 can be improved.

Figure 23:
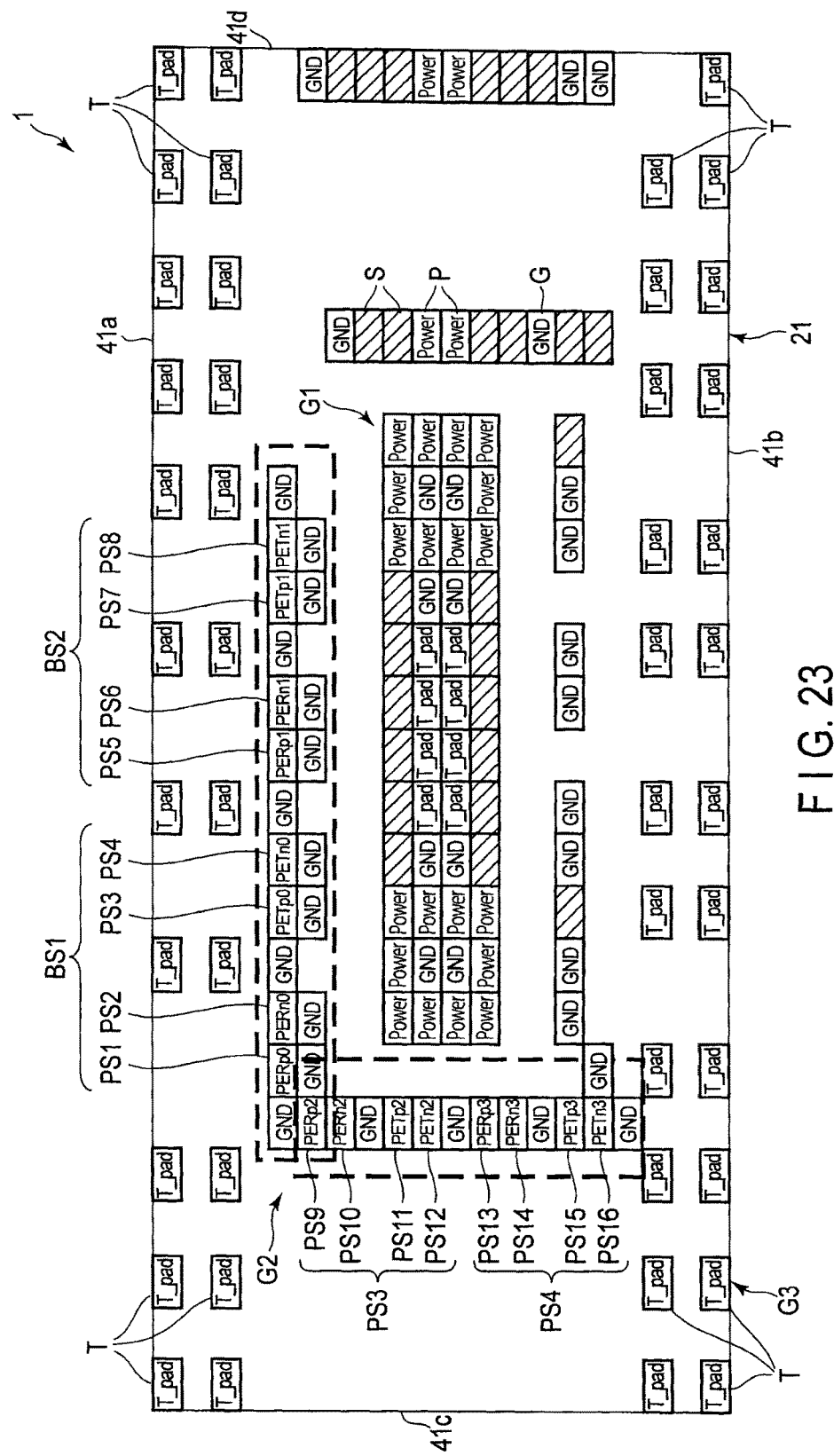
FIG. 23 illustrates, as an example, a fifth modification of the semiconductor package according to the third embodiment.

FIG. 23 illustrates the semiconductor package 1 according to a fifth modification. In this modification, the four solder ball sets BS1, BS2, BS3 and BS4 are divided into two sides of the frame-shaped second group G2 and arranged. That is, the two solder ball sets BS1 and BS2 are located between the first side 41a of the board 21 and the central portion of the board 21, and arranged substantially parallel to the first side 41a of the board 21. On the other hand, the other two sets, i.e., the solder ball sets BS3 and BS4 are located between the third side 41c of the board 21 and the central portion of the board 21, and arranged substantially parallel to the third side 41c of the board 21.

The four solder ball sets BS1, BS2, BS3 and BS4 can be arranged apart from the peripheral end area of the board 21 also in this structure, in comparison with the structure of, for example, the second embodiment. Thus, the connection reliability of the PCIe signal balls PS1 to PS16 included in the four solder ball sets BS1, BS2, BS3 and BS4 can be improved.

(Fourth Embodiment)

Next, a semiconductor package 1 according to a fourth embodiment will be described with reference to FIGS. 24 and 25. It should be noted that structures having functions identical or similar to those of the first and second embodiments will be denoted by the same reference numbers, and their detailed explanations will be omitted. Also, the structures other than those to be described below are the same as in the second embodiment.

The semiconductor package 1 according to this embodiment comprises four solder ball sets in which solder balls 27 are arranged at a pitch of, for example, 0.8 mm and which correspond to PCIe high-speed signals.

Figure 24:
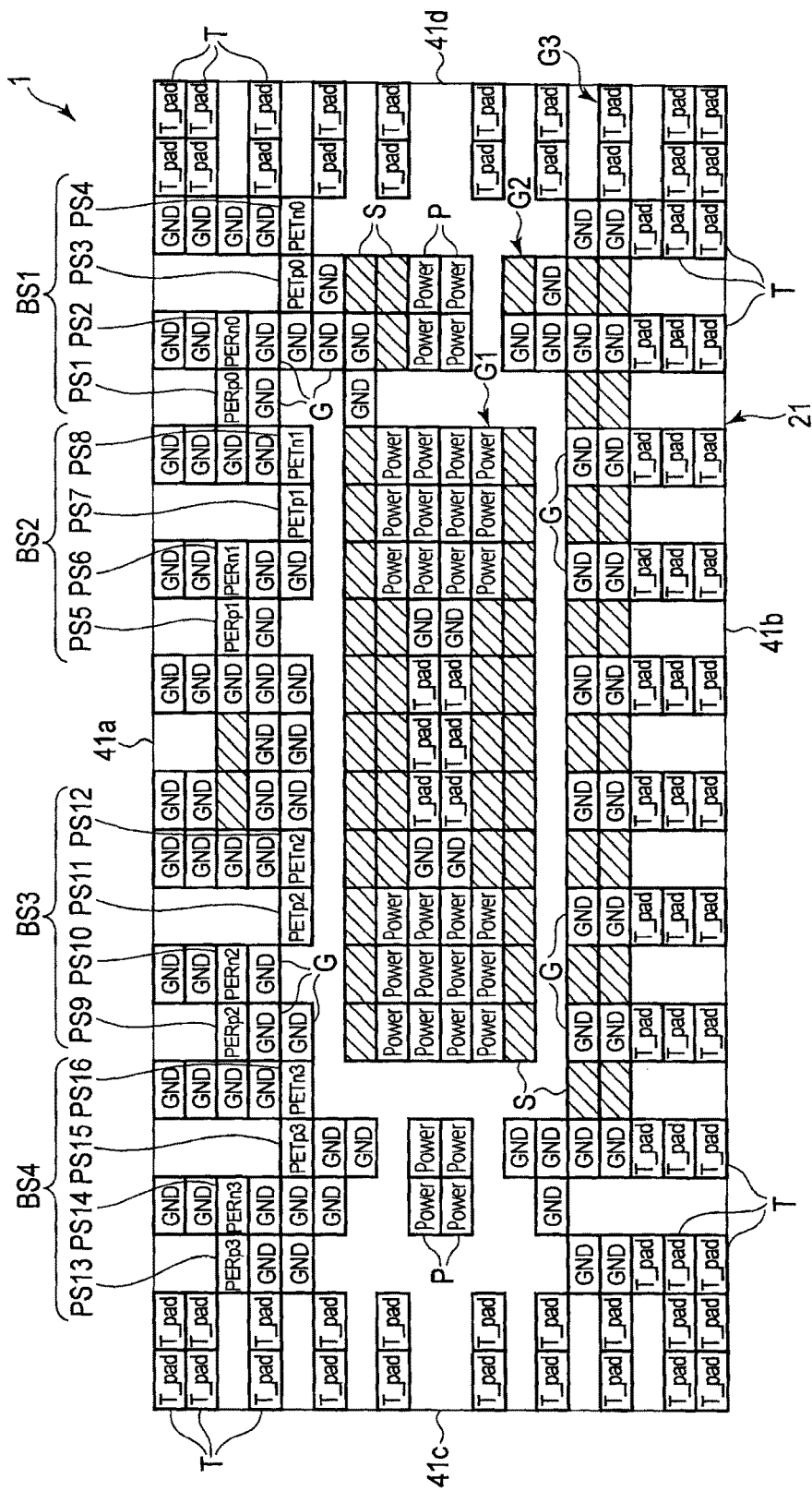
FIG. 24 illustrates, as an example, assignment of solder balls of a semiconductor package according to a fourth embodiment.
Figure 25:
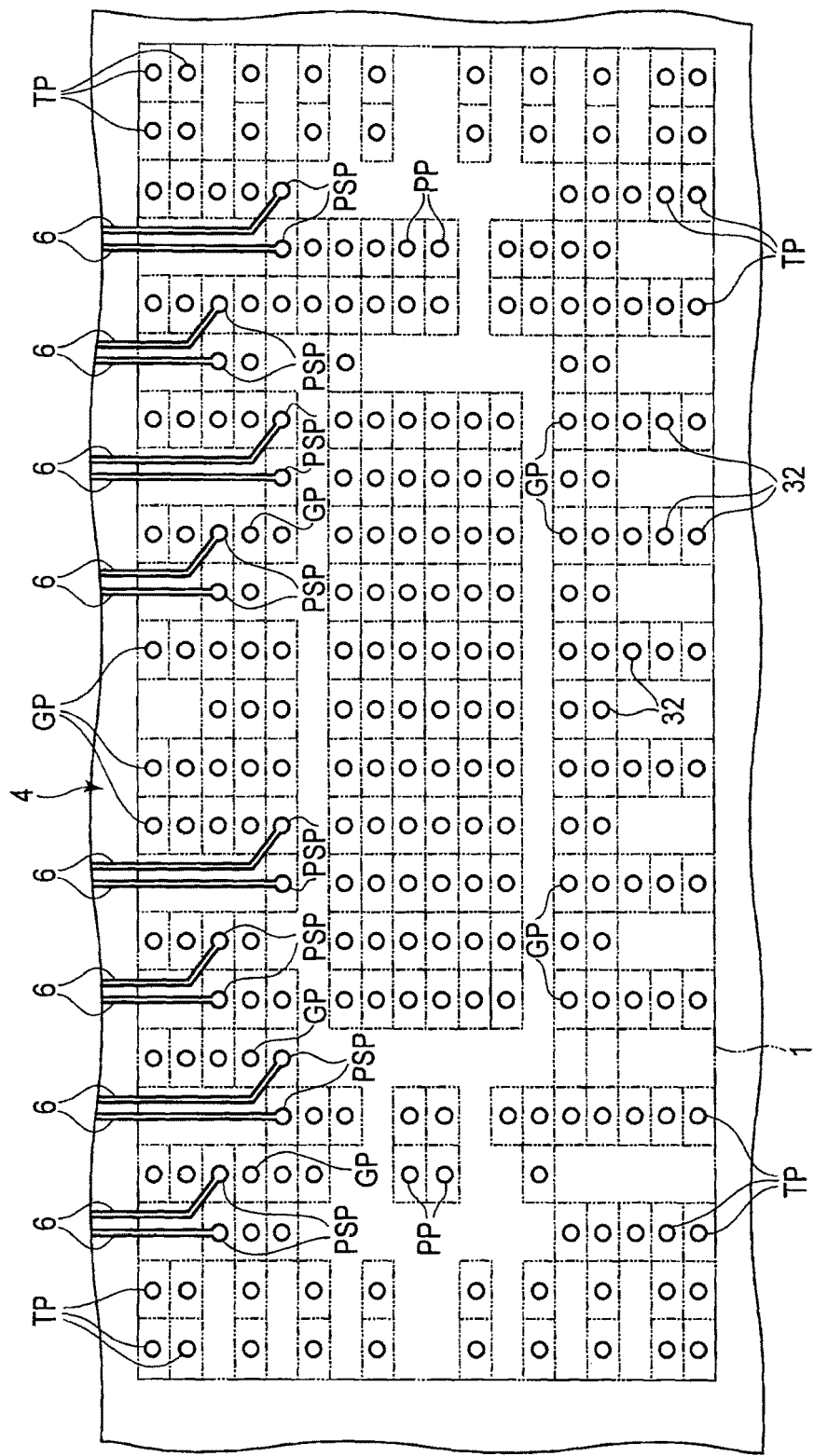
FIG. 25 is an exemplary plan view illustrating pads of a circuit board to which the solder balls shown in FIG. 24 are to be connected.

FIG. 24 schematically illustrates assignment of the solder balls 27 according to this embodiment. It should be noted that FIG. 24 illustrates ball arrangement based on a position where the balls are placed on a circuit board 4 (i.e., based on a position where the semiconductor package 1 is viewed from the above) for convenience of explanation. FIG. 25 illustrates pads 32 on the circuit board 4 to which the solder balls 27 are to be connected.

According to this embodiment, in a first solder ball set BS1, two first solder balls PS1 and PS2 corresponding to a first differential input signal and two second solder balls PS3 and PS4 corresponding to a first differential output signal are positioned to be shifted in a direction crossing (e.g., substantially orthogonal to) a first side 41a of a board 21. A distance between the first solder balls PS1 and PS2 and the second solder balls PS3 and PS4 is substantially the same as that between the two first solder balls PS1 and PS2 or that between the two second solder balls PS3 and PS4 in a direction substantially parallel to the first side 41a of the board 21.

Similarly, in second to fourth solder ball sets BS2, BS3 and BS4, two first solder balls corresponding to a differential input signal and two second solder balls corresponding to a differential output signal are positioned to be shifted in the direction crossing (e.g., substantially orthogonal to) the first side 41a of the board 21. A distance between the first solder balls and the second solder balls is substantially the same as that between the two first solder balls or that between the two second solder balls in the direction substantially parallel to the first side 41a of the board 21.

Furthermore, a distance between the first to fourth solder ball sets BS1, BS2, BS3 and BS4 is substantially the same as that between two first solder balls or two second solder balls of any of the solder ball sets.

According to such a structure, the semiconductor package 1 in which high-speed operation is improved can be provided as in the second embodiment. That is, this embodiment includes at least four solder ball sets corresponding to signal sets each comprising a pair of high-speed differential input and differential output signals conforming to the PCIe standard. The four solder ball sets BS1, BS2, BS3 and BS4 are located between the first side 41a of the board 21 configured to be closest to a host controller 5 and the central portion of the board 21, and the four solder ball sets BS1, BS2, BS3 and BS4 are arranged substantially parallel to the first side 41a of the board 21.

That is, according to such a structure, the amount of data which can be transmitted and received can be further increased by increasing the solder ball sets BS1, BS2, BS3 and BS4 corresponding to the high-speed signals. As a result, the high-speed operation can be improved.

As described above, a peripheral end area of the board 21 is an area where connection reliability of the solder balls 27 may deteriorate because of, for example, thermal stress applied when the semiconductor package 1 is mounted. Thus, if the PCIe signal balls are arranged around the peripheral end area of the board 21, the connection reliability of the PCIe signal balls may deteriorate.

Then, according to this embodiment, in each of the solder ball sets BS1, BS2, BS3 and BS4, the two first solder balls corresponding to the differential input signal and the two second solder balls corresponding to the differential output signal are positioned to be shifted in the direction crossing (e.g., substantially orthogonal to) the first side 41a of the board 21. As a result, the first solder balls and the second solder balls can be arranged close to each other in the direction substantially parallel to the first side 41a of the board 21.

Also, in this embodiment, the distance between the first to fourth solder ball sets BS1, BS2, BS3 and BS4 is substantially the same as that between two first solder balls or two second solder balls of any of the solder ball sets. As a result, the first to fourth solder ball sets BS1, BS2, BS3 and BS4 can be arranged close to each other.

Consequently, the four solder ball sets BS1, BS2, BS3 and BS4 can be arranged apart from the peripheral end area of the board 21, in comparison with the structure of, for example, the second embodiment. Thus, the connection reliability of PCIe signal balls PS1 to PS16 included in the four solder ball sets BS1, BS2, BS3 and BS4 can be improved.

Moreover, according to this embodiment, in each of the solder ball sets BS1, BS2, BS3 and BS4, the two first solder balls are arranged substantially parallel to the first side 41a of the board 21. Also, in each of the solder ball sets BS1, BS2, BS3 and BS4, the two second solder balls are arranged substantially parallel to the first side 41a of the board 21.

Thus, the isometric properties of signal lines 6 of the two first solder balls and that of the two second solder balls can be easily secured, in comparison with the structure of, for example, the third embodiment. Accordingly, the quality of signals to be transmitted and received by the semiconductor package 1 can be improved. Here, it should be noted that in reality, intervals (i.e., pitch) of the solder balls 27 in a lengthwise direction (i.e., a back and forth direction) are substantially the same as intervals (i.e., pitch) of the solder balls 27 in a lateral direction (i.e., a right and left direction), unlike in the figures.

Also, according to the structure of this embodiment, wirings (i.e., wiring patterns) to be connected to ground balls G are easily passed.

As shown above, the first to fourth embodiments and some modifications have been described. However, the embodiments of the present invention are not limited to them. The structures according to each of the embodiments can be properly carried out by modifying, exchanging or combining them.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package configured to be attached to a circuit board comprising a host controller, and to exchange a high-speed signal of a PCI Express standard with the host controller, the semiconductor package comprising:
   a package board comprising a first surface and a second surface opposite to the first surface;
   a controller provided on the first surface of the package board;
   a semiconductor memory chip provided on the first surface of the package board and electrically connected to the controller; and
   solder balls provided on the second surface of the package board, and configured to be connected to pads on the circuit board,
   wherein the solder balls comprise at least four solder ball sets, each of the four solder ball sets includes a first ball and a second ball which are corresponding to positive and negative of high-speed differential input signals of the PCI Express standard and a third ball and a fourth ball which are corresponding to positive and negative of high-speed differential output signals of the PCI Express standard, respectively, the four solder ball sets are located between a side of the package board and a central portion of the package board, wherein the side corresponds to one edge of the package board in a plan view, the side being configured to be closest to the host controller, the four solder ball sets are arranged substantially parallel to the side of the package board, the first ball and the second ball are arranged in a direction substantially orthogonal to the side of the package board in the plan view, and the third ball and the fourth ball are arranged in the direction substantially orthogonal to the side of the package board in the plan view,
   wherein the solder balls further comprise a first ground ball and a second ground ball, the first ground ball being located between the first ball and the third ball and the second ground ball being located between the second ball and the fourth ball, electrically connected to a ground layer of the package board.

2. The package of claim 1, wherein:
   each of the four solder ball sets comprises a first solder ball corresponding to the high-speed differential input signal, and a second solder ball corresponding to the high-speed differential output signal, and
   the first solder ball and the second solder ball are arranged substantially parallel to the side of the package board in each of the four solder ball sets.

3. The package of claim 1, wherein:
   the solder balls further comprise heat radiation balls electrically connected to a ground layer or a power supply layer of the package board, and
   the heat radiation balls are located closer to a peripheral edge of the package board than the four solder ball sets.

4. The package of claim 1, wherein:
   the solder balls comprise power supply balls electrically connected to a power supply layer of the package board and ground balls electrically connected to a ground layer of the package board,
   the pads of the circuit board comprise power supply pads corresponding to the power supply balls, and ground pads corresponding to the ground balls, and
   the power supply balls are arranged substantially point-symmetrically with respect to a center of the package board and the ground balls are arranged substantially point-symmetrically with respect to the center of the package board such that a correspondence relation between the power supply balls and the power supply pads and a correspondence relation between the ground balls and the ground pads are able to be maintained even if the semiconductor package is rotated by 180 degrees relative to a regular direction and attached to the circuit board.

5. A semiconductor device comprising:
   a board comprising a first surface and a second surface opposite to the first surface;
   a controller provided on the first surface of the board;
   a semiconductor chip provided on the first surface of the board and electrically connected to the controller; and
   solder balls on the second surface of the board,
   wherein the solder balls comprise at least four solder ball sets, each of the four solder ball sets includes a first ball and a second ball which are corresponding to a positive and a negative of differential input signals and a third ball and a fourth ball which are corresponding to a positive and a negative of differential output signals, respectively, the plurality of solder ball sets are arranged substantially parallel to a side of the board, wherein the side corresponds to one edge of the board in a plan view, the first ball and the second ball are arranged in a direction substantially orthogonal to the side of the board in the plan view, and the third ball and the fourth ball are arranged in the direction substantially orthogonal to the side of the board in the plan view,
   wherein the solder balls further comprise a first ground ball and a second ground ball, the first ground ball being located between the first ball and the third ball and the second ground ball being located between the second ball and the fourth ball, electrically connected to a ground layer of the board, and wherein the solder balls further comprise first heat radiation balls electrically connected to the ground layer or a power supply layer of the board, and the first heat radiation balls are located between the first and second ground balls and the side of the board wherein: the positive and the negative of differential input signals and the positive and the negative of differential output signals are high-speed signals of a PCI Express standard.

6. The device of claim 5, wherein:

each of the solder ball sets comprises a first solder ball corresponding to the differential input signal and a second solder ball corresponding to the differential output signal, and the first solder ball and the second solder ball are arranged substantially parallel to the side of the board in each of the solder ball sets.

7. The device of claim 5, wherein:

each of the solder ball sets comprises two first solder balls corresponding to the differential input signal and two second solder balls corresponding to the differential output signal, and the two first solder balls and the two second solder balls are arranged substantially parallel to the side of the board in each of the solder ball sets.

8. The device of claim 5, wherein:

the board comprises a first area closer to a central portion of the board than the solder ball sets, and a second area located on an outer peripheral area from the solder ball sets, and arrangement density of the first heat radiation balls in the second area is higher than arrangement density of second heat radiation balls in the first area.

9. The device of claim 5, wherein:

the solder balls comprise power supply balls electrically connected to the power supply layer of the board and third ground balls electrically connected to a ground layer of the board, and the power supply balls are arranged substantially point-symmetrically with respect to a center of the board, and the ground balls are arranged substantially point-symmetrically with respect to the center of the board.

10. A semiconductor device comprising:

a package board comprising a first surface and a second surface opposite to the first surface;

a sealing portion on the first surface of the package board;

a controller covered with the sealing portion;

a semiconductor memory chip electrically connected to the controller and covered with the sealing portion; and solder balls provided on the second surface of the package board, and configured to be connected to pads on the package board, wherein the solder balls comprise a first group, a second group and a third group, the second group being located around the first group, the third group being located around the second group, the first group includes power supply balls electrically connected to a power supply layer of the package board and first ground balls electrically connected to a ground layer of the package board, and the power supply balls are arranged substantially point-symmetrically with respect to a center of the package board and the first ground balls are arranged substantially point-symmetrically with respect to the center of the package board such that a correspondence relation between the power supply balls and power supply pads and a correspondence relation between the ground balls and ground pads are able to be maintained even if the semiconductor package is rotated by 180 degrees relative to a regular direction and attached to a circuit board, wherein the second group comprises at least four solder ball sets, each of the four solder ball sets includes a first ball and a second ball which are corresponding to positive and negative of differential input signals of the PCI Express standard and a third ball and a fourth ball which are corresponding to positive and negative of differential output signals of the PCI Express standard, respectively, the four solder ball sets are located between a side of the package board extending in a first direction and a central portion of the package board, wherein the side corresponds to one edge of the board in a plan view, the side being configured to be closest to a host controller, the four solder ball sets are arranged in the first direction, the first ball and the second ball are arranged in a second direction and the third ball and the fourth ball are arranged in the second direction, and the second direction is orthogonal to the first direction in the plan view, and wherein the third group comprises heat radiation balls which are grounded.

11. The device of claim 10, wherein:

distance between the heat radiation balls in the first direction is greater than distance between the first ball and the second ball.

12. The device of claim 11, further comprising:

signal lines arranged between the heat radiation balls.

13. The device of claim 11, wherein:

the signal lines are arranged along the second direction.

14. The device of claim 10, further comprising:

second ground balls arranged among the first ball, the third ball, the second ball and the fourth ball.

15. The device of claim 14, wherein:

the second ground balls are arranged along the heat radiation balls in the second direction.

* * * * *